(12) United States Patent
Brankovic et al.

(10) Patent No.: US 6,377,616 B1
(45) Date of Patent: Apr. 23, 2002

(54) CALIBRATION OF N-PORT RECEIVERS

(75) Inventors: Veselin Brankovic, Fellbach; Dragan Krupezevic, Stuttgart, both of (DE)

(73) Assignee: Sony International (Europe) GmbH, Koln-Ossendorf (DE)

( * ) Notice: Subject to any disclaimer, the term of this patent is extended or adjusted under 35 U.S.C. 154(b) by 0 days.

(21) Appl. No.: 09/286,893

(22) Filed: Apr. 6, 1999

Related U.S. Application Data

(63) Continuation of application No. PCT/EP98/02856, filed on May 14, 1998.

(51) Int. Cl.[7] .......................... H04B 3/46; H04B 17/00; H04Q 1/20

(52) U.S. Cl. ...................... 375/224; 702/85; 702/120; 702/121

(58) Field of Search .......................... 375/224; 324/601, 324/650, 638, 642; 702/85, 106, 107, 120, 121, 122, 124

(56) References Cited

U.S. PATENT DOCUMENTS

| | | | |
|---|---|---|---|
| 5,498,969 A | * | 3/1996 | Huyart et al. ............... 324/638 |
| 5,552,714 A | * | 9/1996 | Adamian et al. ............ 324/601 |
| 5,568,520 A | | 10/1996 | Lindquist et al. |

FOREIGN PATENT DOCUMENTS

| | | |
|---|---|---|
| EP | 0 805 561 A2 | 11/1997 |
| EP | 0 841 756 A2 | 5/1998 |

OTHER PUBLICATIONS

Li et al., "A Six–Port Direct Digital Millimeter Wave Receiver", IEEE MTT–S International Microwave Symposium Digest, San Diego, May 23–27, 199, vol. 3, pp. 1659–1662.

* cited by examiner

*Primary Examiner*—Mohammad H. Ghayour
(74) *Attorney, Agent, or Firm*—Frommer Lawrence & Haug LLP; William S. Frommer

(57) ABSTRACT

According to the present invention a method for calibrating a six-port receiver as well as a receiving apparatus are provided. The receiving apparatus according to the present invention comprises a six-port receiver with a passive circuit (7) with two inputs, at least one input being supplied with a high frequency signal to be measured, and at least three outputs supplying power levels P1, P2, P3, P4 for a signal processing unit (10) which calculates a complex signal based on the at least three power levels P1, P2, P3, P4 and calibration coefficients. Furthermore the receiving apparatus according to the present invention comprises devices (30, 35, 36) for supplying a predetermined calibration sequence with different symbols to the at least one input for the signal to be measured. The signal processing unit (10) calculates the calibration coefficients based on the calibration sequence.

31 Claims, 16 Drawing Sheets

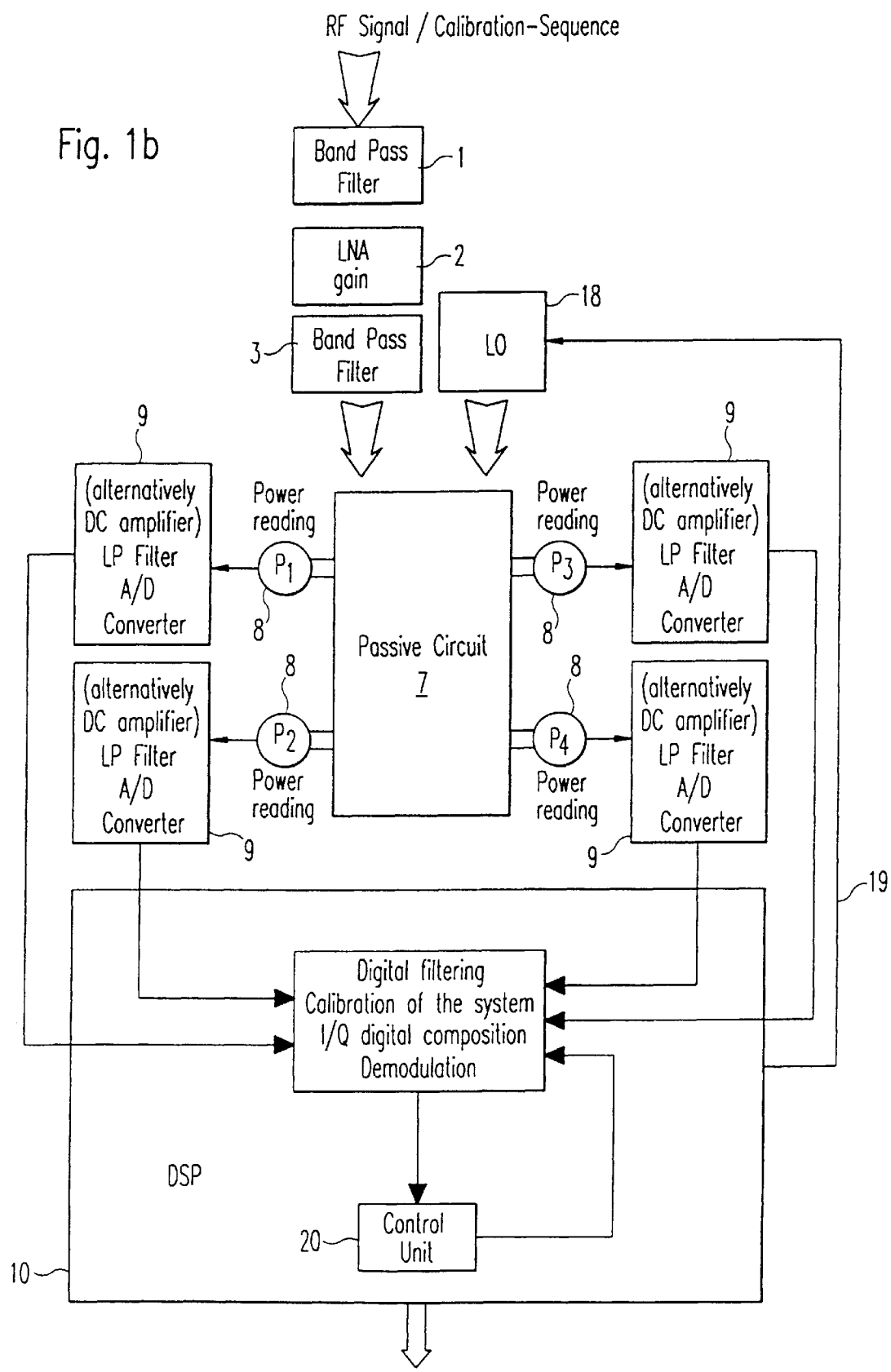

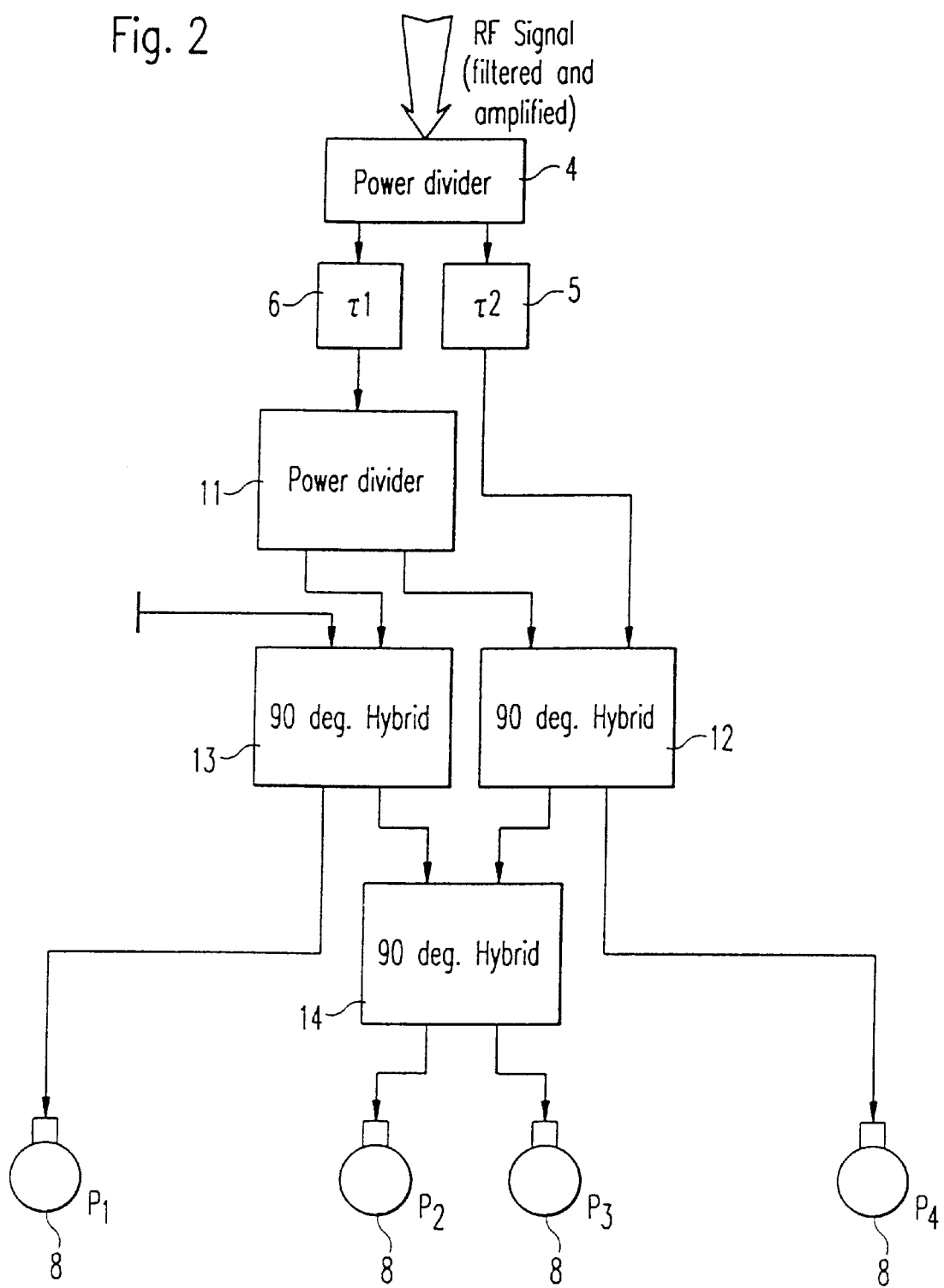

Calibration Procedure in the Assembly Process

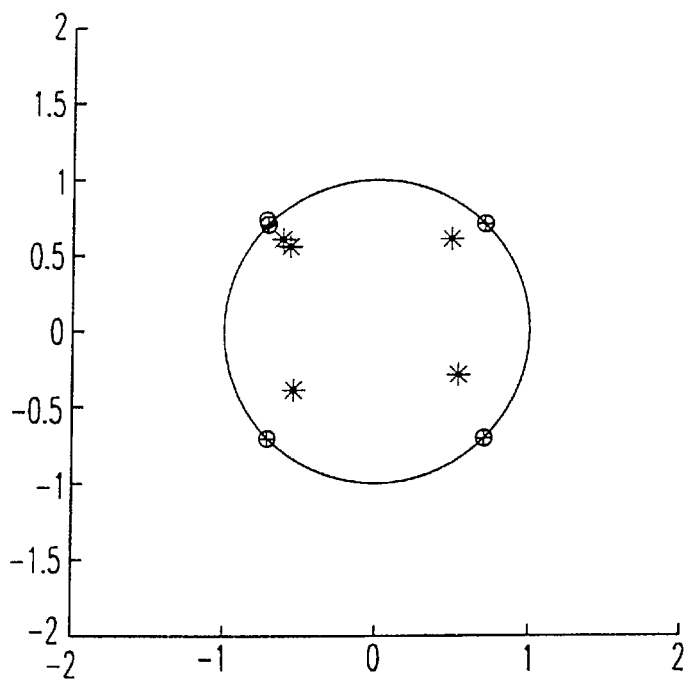
Correct, Detected and Calibrated values in the case of S/N ratio of 50dB
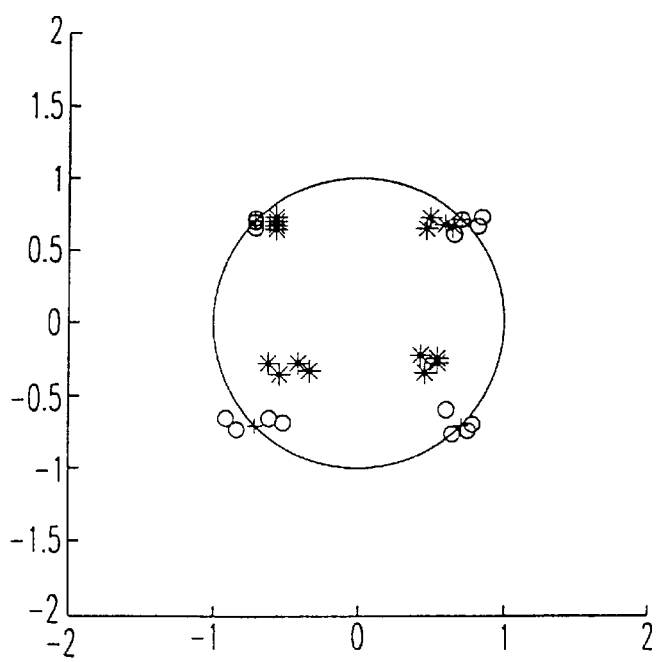
Correct, Detected and Calibrated values in the case of S/N ratio of 20dB

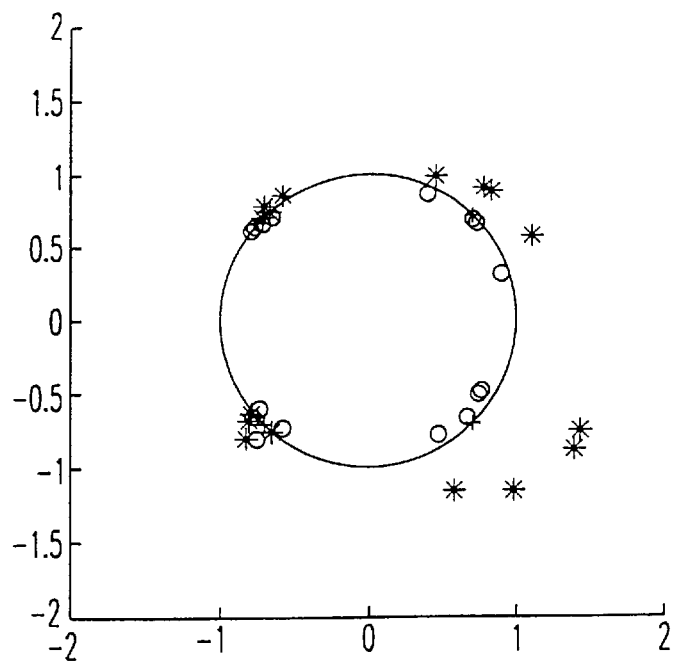
Correct, Detected and Calibrated values in the case of S/N ratio of 10dB
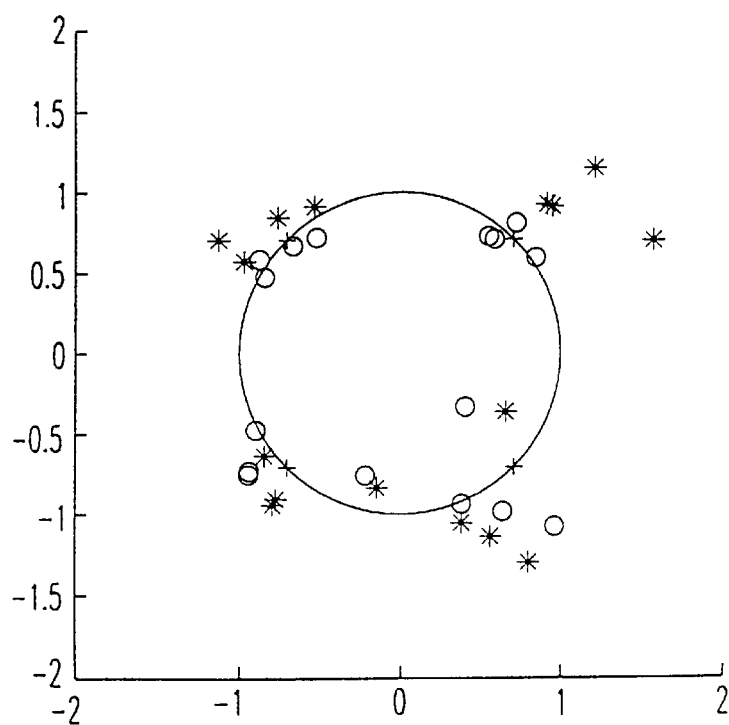
Correct, Detected and Calibrated values in the case of S/N ratio of 7dB Correct, Detected and Calibrated values in the case of S/N ratio of 50dB, in the case when RF signal is 10dB under LO signal. It can be seen how much is calibration needed if RF signal and LO signals does not have the same values.

Correct, Detected and Calibrated values in the case of S/N ratio of 20dB, in the case when RF signal is 20dB under LO signal.

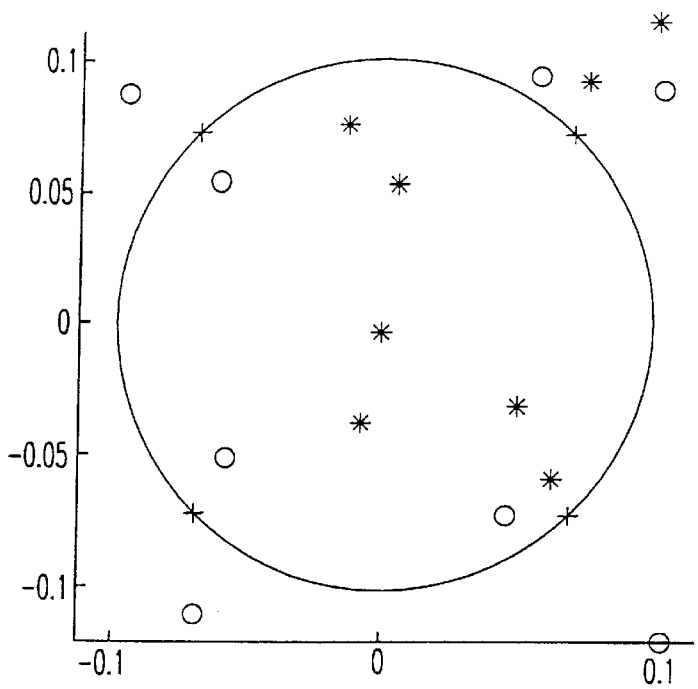

Fig. 22

Correct,Detected and Calibrated values in the case of S/N ratio of 10dB, in the case when RF signal is 20dB under LO signal. It can be that without calibration no QPSK signals can be properly detected.

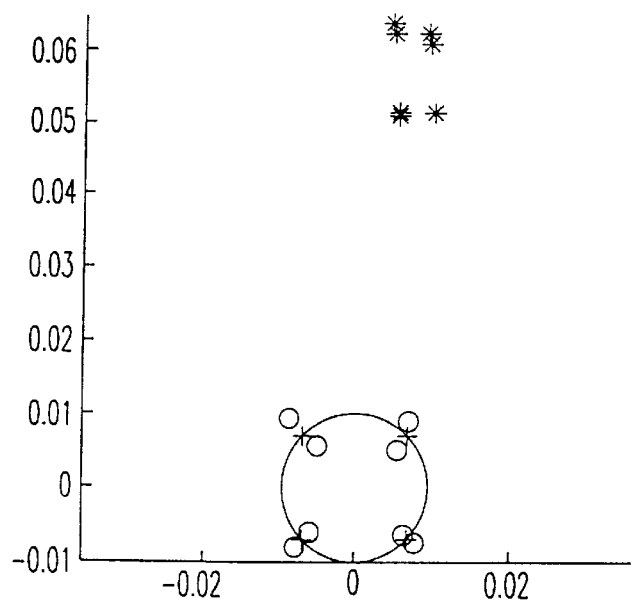

Fig. 23

Correct,Detected and Calibrated values in the case of S/N ratio of 20dB, in the case when RF signal is 30dB under LO signal. It can be that without calibration no QPSK signals can be detected.

Correct, Detected and Calibrated values in the case of S/N ratio of 10dB, in the case when RF signal is 30dB under LO signal.

Correct, Detected and Calibrated values in the case of S/N ratio of 50dB, in the case when RF signal has the same level as LO signal. Note that in this case polynomial calibration of the fourth order is used for the calibration of the (72)PSK signal.

Correct,Detected and Calibrated values in the case of S/N ratio of 30dB, in the case when RF signal has the same level as LO signal. Note that in this case polynomial calibration of the fourth order is used for the calibration of the (320)PSK signal. Values without calibration are presented as a line.

CALIBRATION OF N-PORT RECEIVERS

This is a continuation of copending International Application PCT/EP98/02856 having an international filing date of May 14, 1998.

FIELD OF THE INVENTION

The present invention relates to a method for calibrating n-port receivers as well as to a receiving apparatus provided with means for supplying a signal to calibrate a n-port receivers comprised in the receiving apparatus. The present application is furthermore directed on a mobile communication device provided with such a receiving apparatus.

BACKGROUND OF THE INVENTION

When referencing to n-port receivers in the following description, n is an integer which can assume the value of four, five and six. As the case of n equal to six is known in the prior art, the following description is made with reference to a six-port receiver. However, the present invention is by no means limited on the case of n equal to six. The calibration of a n-port receiver is essentially independent of the fact whether n is four, five or six.

Recently it has been shown that a so-called six-port receiving circuit in conjunction with a digital signal processor is capable of performing digital demodulation directly at frequencies ranging from microwave to mm-wave bands. This new direct digital receiver promises reduced receiver complexity, low fabrication requirements and fair performance in providing a cost-effective alternative to the conventional heterodyne structure used in various digital terminals.

FIG. 3b shows schematically the application area of a direct six-port receiver as a partial or complete replacement of a conventional heterodyne receiver structure (FIG. 3a).

FIG. 4 shows the structure of a six-port receiver known from Bossisio, Wu "A six-port direct digital millimeter wave receiver", Digest of 1994 IEEE MTT Symposium, vol. 3, page 1659–1662, San Diego, May 1994.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels at at least three and particularly four of the six ports. The imperfections of the hardware can be readily eliminated by an appropriate calibration procedure. Very accurate measurements can be made of a large dynamic range and wide frequency range. six-port junction receivers consist of passive microwave components such as directional couplers and power dividers as well as diode detectors. The circuit can be easily integrated as MHMIC or MMIC. The known receiver performs direct phase/amplitude demodulation at microwave and mm-wave frequencies. The traditional I-Q block in a receiver is replaced by a six-port phase/frequency discriminator which contains a six-port receiver and a digital signal processing (DSP) unit. The incoming digitally modulated RF-signal is compared with the output of a digital controlled local oscillator 18. Carrier recovery is first performed. The DSP-unit 17 detects the frequency difference of the signals and then controls the local oscillator 18 to track the incoming signal. Once the carrier is recovered the instantaneous phase of the received signal is detected and decoded so as to recover the original modulated data. The maximum data transmission rate is determined mainly by the sampling rate of the A/D-converters 16 and the processing speed of the DSP-unit 17.

Six-port receivers generally require a calibration. One major advantage of the six-port receiver is the ability to cope with non-perfect (non-ideal) RF sub-systems. Calibration procedures extract the imperfections of the six-port-hardware. The results of the calibration are in general complex coefficients. Those complex coefficients multiplied with the measured power levels at different ports are required to calculate the (relative) amplitude and (relative) phase of the incoming signal of the receiver. The relative magnitude and the relative phase are related to the coherent or non-coherent detection of the signal.

The calibration parameters are in general non-time dependent or very slowly changeable with time. Theoretically, the calculation of the correction calibration parameters is required to be performed only once. However, in practice they should be performed every time a very large time period has elapsed, which very large time period should be evaluated on case by case basis. The changing of the RF parameters depends on the environmental conditions as well as the manufacturing imperfections.

From the state of the art different calibration techniques for a six-port receiver structure have been proposed. They are generally applied for six-port structures for net work measurement issues and such as usage of hardware termination for calibration like known loads, shorts and sliding shorts.

Such calibration techniques are known from G F Engen, "Calibrating the six-port reflectometer by means of sliding termination", IEEE Trans. Microwave Theory Technique, vol. 26., pages 987–993, December 1978 and U. Stumper, "Finding initial estimates needed for the Engen method of calibrating single six-port reflectometers", IEEE Trans. Microwave Theory Technique, vol. 38, pages 951–957, July 1990 as well as F. Wiedmann, B. Huyert, E. Bergeault and L. J. Allet "A new robust method for six-port reflectometer calibration" which has been submitted to the IEEE transaction.

The disadvantage of all those known hardware calibrations is the inherently required cutting-off of the physical connections in order to assemble particular termination, which is in the case of receiver applications absolutely impractical.

Recently a calibration procedure for a six-port coherent direct receiver without physical disconnection of the system has been disclosed in J. Li, R. G. Bosisio and K. Wu "Dual-tone calibration of six-port direct digital millimetric receiver", IEEE Trans. Microwave Theory Technique, vol. 44, pages 93–99, January 1996. However, this known technique requires complicated monitoring of the outputs, large observation time and the alternation (change) of the local oscillator (see reference 18 in FIG. 4) level. In this document it is disclosed two use simply two different frequencies without any modulation and to supply them to the input ports of a six-port receiver.

There is a plurality of requirements for a calibration procedure for a direct receiver based on a six-port structure:

The calibration should be effected without physical disconnection of the system using the same programmed sampling rate as for the data transmission, the time for calibration should be as short as possible and the required computational effort for calibration coefficients should be minimized and adapted to fast hardware digital computation units.

Therefore it is an object of the present invention to provide a calibration procedure generally for n-port receivers, which calibration procedure satisfies the above-mentioned conditions.

The basic idea of the present invention is to use a calibration sequence for direct n-port receiver structures with coherent or non-coherent demodulation. Said predefined calibration sequence is fed to the input of the direct receiver. A carrier frequency is used and a pre-defined sequence is applied as the modulation sequence of the carrier frequency.

SUMMARY OF THE INVENTION

According to the present invention therefore a method for calibrating a n-port receiver is proposed, said n-port receiver comprising a passive circuit with two inputs, at least one input being supplied with a high-frequency signal to be measured, and at least three outputs supplying power levels for a signal processing unit, which signal processing unit calculates a complex signal based on the at least two power levels and calibration coefficients. A predetermined calibration sequence with different symbols is fed to the at least one input for the signal to be measured and the calibration coefficients are calculated based on the calibration sequence.

When referencing to n-port receivers in the following description, n is an integer which can assume the value of four, five and six. As the case of n equal to six is known in the prior art, the following description is made with reference to a six-port receiver. However, the present invention is by no means limited on the case of n equal to six. The calibration of a n-port receiver is essentially independent of the fact whether n is four, five or six.

The calibration sequence can be a modulated RF signal.

The calibration sequence can comprise at least five different states (symbols).

The calibration sequence can be a n-PSK modulated signal.

The number of different symbols in the calibration sequence can be N and the minimum phase distance between two symbols of the calibration sequence can be $2\pi/N$.

The time duration of the calibration sequence can be at least five time sample periods of the six-port receiver.

Usually a predetermined (known) modulation scheme will be used. In this case the calibration sequence can comprise preferably only symbols corresponding to modulation states of the predetermined modulation scheme.

Particularly the calibration sequence can comprise symbols corresponding to all modulation states of the predetermined modulation scheme. A calibration vector can be calculated on the basis of a matrix representing the modulation states of the predetermined modulation scheme and a matrix of the values detect by the six-port receiver.

The correction values of the output signals of the six-port receiver can then be calculated on the basis of the calibration vector.

The calibration sequence can be fed repeatedly to an input of the six-port receiver.

The calibration sequence can be generated by a remote transmitter.

Alternatively, the calibration sequence can be generated by an additional hardware block connected to the six-port receiver. The additional hardware block can be for example a RF source modulated by the predefined calibration sequence.

As a further alternative the calibration sequence can be generated by a local transmitter, which is particularly advantageous in the case of a TDD transmission system because of the identical operation frequency.

The calibration sequence generated by the local transmitter can be supplied to the six-port receiver without power amplification.

The present invention furthermore proposes the use of a calibration method as mentioned above, wherein the six-port receiver is comprised in a mobile telecommunications device.

The present invention furthermore relates to a receiving apparatus. The receiving apparatus comprises a n-port receiver with a passive circuit with two inputs, at least one input being supplied with a high-frequency signal to be measured, and at least three outputs supplying power levels for a signal processing unit which calculates a complex signal based on the at least two power levels and calibration coefficients. The receiving apparatus furthermore comprises means for supplying a predetermined calibration sequence with different symbols to the at least one input for the signal to be measured. The signal processing unit calculates the calibration coefficients based on the calibration sequence.

The n-port receiver can be a six-port receiver.

The calibration sequence can be a modulated RF signal.

The calibration sequence can comprise at least five different states (symbols).

The calibration sequence can be a PSK modulated signal or a D (differential) PSK modulated signal.

The number of different symbols in the calibration sequence can be N and the minimum phase distance between two symbols of the calibration sequence can be $2\pi/N$.

The duration of the calibration sequence can be at least five time sample periods of the six-port receiver.

The means for supplying the calibration sequence can be a remote transmitter.

Alternatively, the means for supplying the calibration sequence can be an additional hardware block connected to the six-port receiver.

As a further alternative the means for supplying the calibration sequence can be a local transmitter.

According to the present invention furthermore a receiving apparatus according to any of the proceeding claims is proposed.

Preferred embodiments of the invention will now be explained referring to the figures of the annexed drawings.

BRIEF DESCRIPTION OF DRAWINGS

FIG. 1b schematically shows a coherent six-port receiver,

FIG. 2 shows the passive circuitry of this receiver according to FIG. 1a in a detailed way, FIGS. 16 to 26 show simulation results when using a calibration method according to the present invention in case a known modulation scheme is used.

DETAILED DESCRIPTION

Figure 1A:
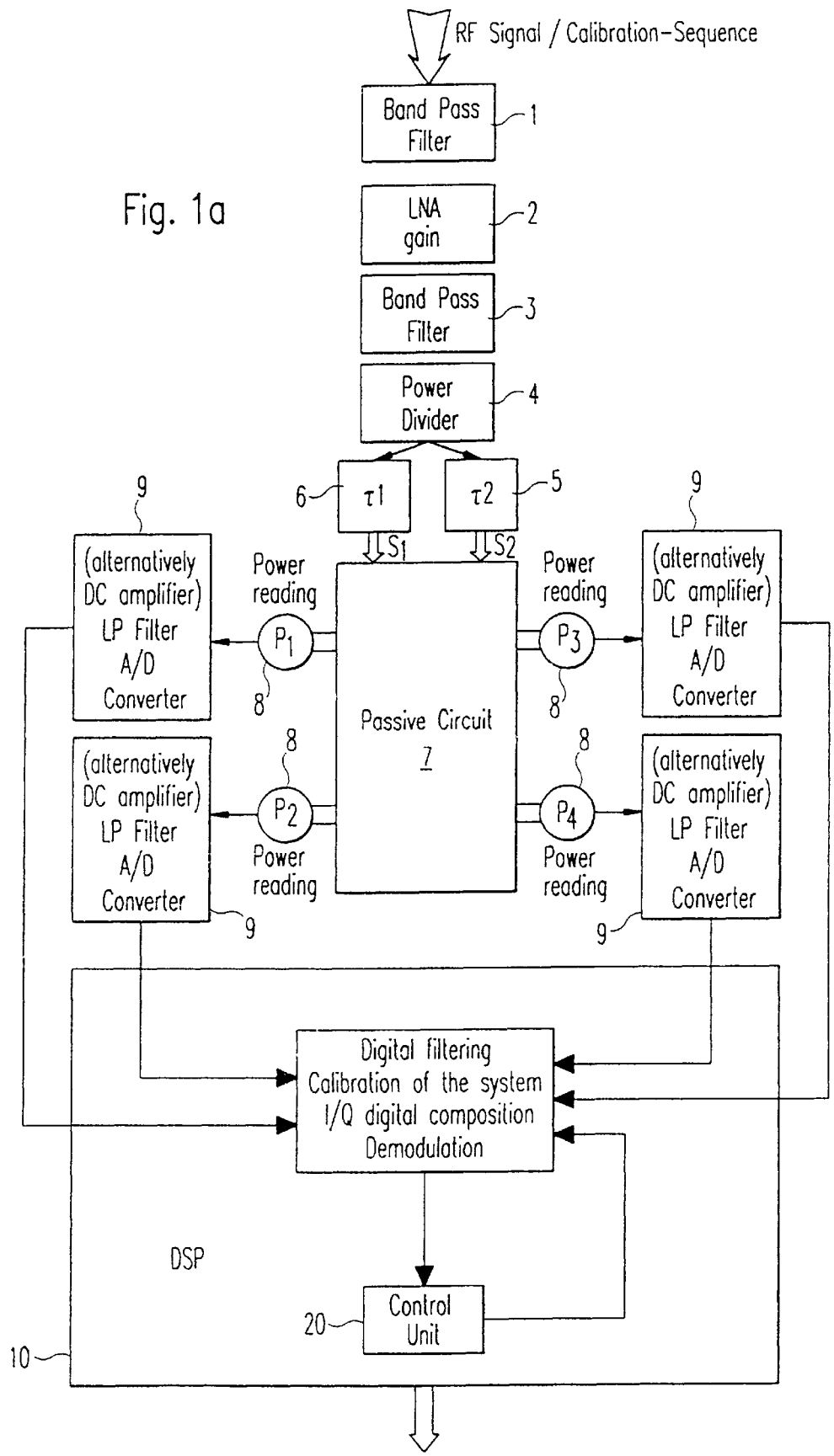
FIG. 1a schematically shows a non-coherent six-port receiver.

The present invention is generally applicable on n-port receivers. The invention is equivalently applicable for non-coherent and coherent six-port receiver structures. A non-coherent six-port receiver is depicted in FIG. 1a. A coherent six-port receiver is depicted in FIG. 1b.

A non-coherent six-port receiver will now be explained referencing to FIG. 1a.

FIG. 1a shows the general concept of a direct six-port receiver based on non-coherent detection according to the present invention. As can be seen from FIG. 1a a received RF-signal is passed through a band pass filter 1, LNA-amplified 2, again passed through another band pass filter 3 and then output to a power divider 4. The power divider 4 divides the supplied RF-signal in two branches S1 and S2. One branch S1 is output to a first delay line 6 with a delay constant τ1. The other branch's output to a second delay line 5 with a delay constant τ2 which is different to the delay constant τ1 of the first delay line 6. The two branches S1, S2 divided by the power divider 4 and delayed by the first 6 and second delay line 5 are then input to a passive circuit 7. The passive circuit 7 provides for different linear combinations of the two input signals. The passive circuit 7 preferably only comprises linear passive components such as detector diodes.

The amplitude, i.e. the power of the at least three linear combinations calculated by the passive circuit 7 and preferably the four linear combinations provided by the passive circuit 7 are then detected by power reading circuits 8. The power reading circuits 8 preferably comprise only detector diodes. As it has already been stated, the minimum number of detected power levels detected by the power reading circuits 8 is three. In the example shown in FIG. 1 the passive circuit 7 provides for 4 linear combinations of the two input signals S1 and S2, and therefore four power levels are detected on the four linear combinations. The example of FIG. 1 therefore provides for a certain redundancy of the entire system.

The output of the power reading circuits 8, i.e. the detected power levels are then respectively given to circuits 9, which comprise low pass filters and A/D converters. Alternatively, the circuitry 9 can comprise DC amplifiers. Therefore the circuitry 9 respectively amplifies the detected power level output by the power reading circuits 8 and converts them digitally. The digital output signals of the circuitry 9 are then respectively given to a digital signal processing unit 10. The digital signal processing unit 10 provides for a digital filtering of the input signals, a calibration of the system, which will be explained afterwards, the calculation of the I/Q parts of the input signals as well as a further processing such as a demodulation.

As can be seen from FIG. 1a the non-coherent direct six-port receiver essentially consists of two inputs (RF-band) approaching a passive RF structure. Passive RF structure is defined as a passive circuitry, designed to function in frequency bands beginning of tenths of MHz up to tenths of GHz depending on different realization issues. The passive structure contains several (at least three, preferably four) power detectors. The outputs of the power detectors 8 are DC voltages in the base band which are sampled by the A/D converter 9 after a possible amplification (optionally) and filtering.

The two delay lines 5, 6 are provided to suppress the local oscillator of the coherent type six-port receiver as shown in FIG. 1b. The two delay lines 5, 6 provide for a relative delay between the two branches divided by the power divider 4 of the RF signal, the relative delay of which is $\tau=\tau_1-\tau_2$. As it is only important to provide for a relative delay between the two branches divided by the power divider 4, $\tau_2$ can be 0 and the corresponding delay line 6 can be suppressed. The relative delay τ between the two branches divided by the power divider 4 is equal or greater than the inverse of the sampling rate of the A/D converter 9.

As can be seen from FIG. 1a and FIG. 1b a six-port receiver allows a detection of vector information, i.e. a phase on the amplitude of the RF signal based only on scalar information (power levels detected by the power reading circuits 8). The method how the vector information representing the relation (ratio) between the two branches of the input signal which are delayed relatively to each other (delay lines 5, 6) in the digital signal processing unit 10 will be explained later on.

In the example shown in FIG. 1a the detected power levels are A/D converted 9 and then digitally processed. However, in the case the input RF signal is modulated in a simple way, the detected analog power levels have not to be A/D converted and can be processed in an analog way.

In any case, in the calculation block provided by the digital signal processing unit 10 an complex signal representing a ratio of the two input RF-signals provided by the power divider 4 is calculating using additional calibration coefficients obtained from a calibration procedure. The complex signal can then be further optionally decomposed to I/Q data streams to be further used for a conventional demodulation procedure in a base band.

Optionally additional LNA and additional BPF can be placed after the delay lines 5, 6 or integrated within the delay lines 5, 6 before approaching the inputs of the passive circuitry structure 7.

Now the elements constituting the six-port receiver will be explained in a more detailed way:

The passive RF circuit 7 is a circuit including only passive linear components, this can include power dividers, hybrids, couplers, transmission lines, matching elements, resistors, capacitors in a different number of each art of component and compositions. A whole passage circuitry can be realized with distributed or lump elements. The design of the transmission lines, substrates or re-used lump elements is arbitrary and is usually set to optimize the passive circuit 7 to defined bands of interest, which are called RF frequency bands in the following explanation.

Figure 3:
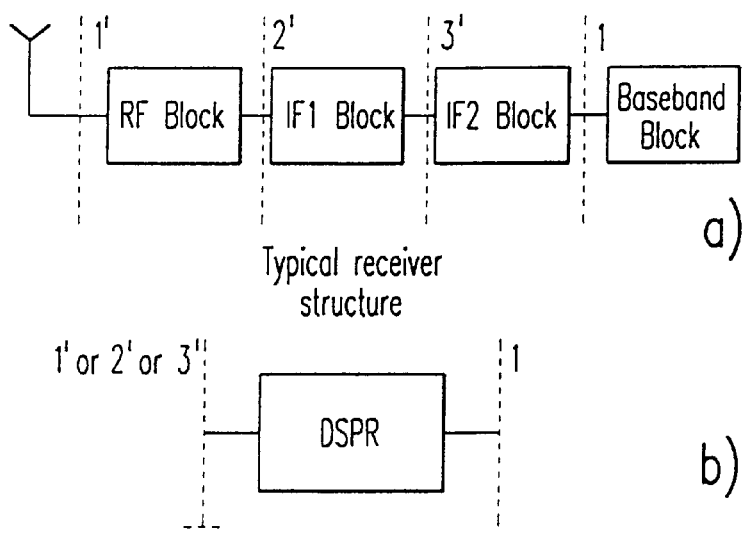
FIG. 3 shows the partial complete replacement of a heterodyne receiver (FIG. 3a) by a direct six-port receiver (FIG. 3b)
Figure 4:
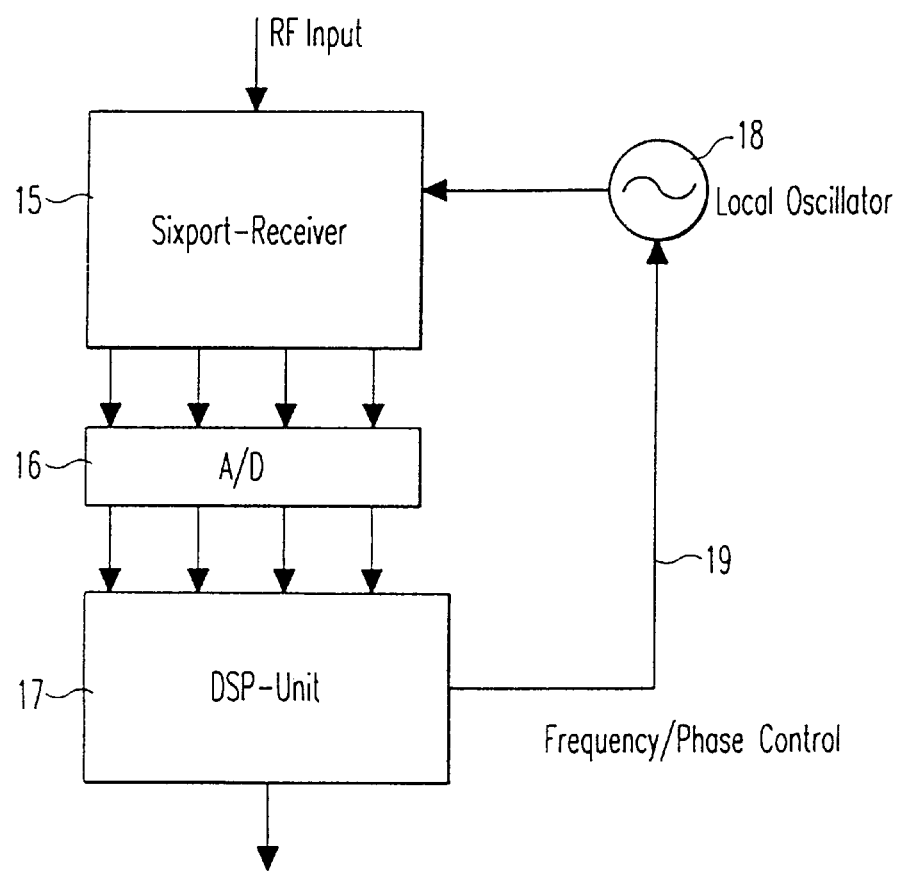
FIG. 4 shows a coherent six-port receiver according to the state of the art.

The RF frequency band is a band of interest. The RF frequency band represents a frequency band in which the proposed receiver structure functions. RF frequency band can also be understood as an intermediate frequency band of a more complex receiver circuitry. In that case, the proposed receiver functions as a direct conversion circuitry from intermediate frequency to the base band. As it is shown in FIG. 3a and FIG. 3b, the direct six-port-receiver can process in that case the intermediate frequency signal obtained from another intermediate frequency or higher RF frequency signal by one of the classic down-conversion techniques. The RF frequency signal can take frequency values in the range of 50 MHz to 100 GHz. The RF frequency signal is filtered and amplified before approaching the passive circuit 7. Before the first band pass filtering 1 additional structures can be utilized to provide frequency channel assignment if necessary.

As it has already been stated above, the passive circuit 7 provides for at least three and preferably four linear combinations of the two input signals $S_1$ and $S_2$ output by the delay lines 6 and 5, respectively. Said four power levels $P_1$, $P_2$, $P_3$ and $P_4$ are calculated based on the two input signals $S_1$, $S_2$ according to the following equation 1:

$P_1 = a \times S_1 + b \times S_2$ $P_2 = c \times S_1 + d \times S_2$ $P_3 = e \times S_1 + f \times S_2$ $P_4 = g \times S_1 + h \times S_2$ The power levels $P_1$, $P_2$, $P_3$ and $P_4$ are detected by the power reading circuits (power detectors) 8. A power detector is a device which converts power of the signals coming in the frequency range of the RF frequency band to a DC voltage information. It can be realized in different technologies. The most usual technology for the practical implementation and realization of the digital 6-point receiver is the realization with common detector diode approach. Detector diodes can be integrated on one chip together with the passive circuit 7. Detector diodes is to be understood as detector diodes with an optional circuitry for temperature compensation.

The digital signal processing unit 10 calculates a complex signal out of the amplified, filtered and A/D-converted power levels $P_1$, $P_2$, $P_3$ and $P_4$, which complex signal represents the relation (ratio) between the two input signals $S_1$ and $S_2$. The digital signal processing unit 10 is a hardware which allows digital signal processing of the bits coming from the A/D converter 9. The basic functions of digital signal processing unit 10 are:

digital low pass filtering, calculation of the mentioned complex signal, calculation of the calibration coefficients obtained from a calibration procedure and transformation of the complex signal to the real and imaginary parts (I/Q-output) if required.

The calculation of the complex signal as well as the calculation of the calibration coefficients is done using alternatively software digital signal processing capabilities or hardware capabilities (ASIC or similar). This depends on the considered data rates to be processed. The processing done by the digital signal processing unit 10 can be realized in conjunction with a demodulation procedure using the same hardware parts (e.g. the same digital signal processing).

In the following it will now be explained how the digital signal processing unit 10 calculates the mentioned complex signal representing the ratio between the two input signal S1 and S2. The complex signal is a signal which is calculated in the digital signal processing unit 10 using calibration coefficients and combinations of relative power levels, which are detected by the power reading circuits 8 and presented as ratios of voltages. The typical structure of the complex signal with the usual number of power reading circuits 8 (4) is presented in the following equation 2:

$$\vec{a} = |a|e^{j\varphi} = \frac{\sum_{i=1}^{3}(x(i)+jy(i))p_i}{\sum_{i=1}^{3}(x_1(i)+j(y_1(i))p_i}$$

$$= \frac{\vec{s}(\tau_1)}{\vec{s}(\tau_2)} = \left|\frac{\vec{s}(\tau_1)}{\vec{s}(\tau_2)}\right|e^{j(2\pi(f(\tau_1)-f(\tau_2))\Delta\tau+\theta(\tau_1)-\theta(\tau_2))}$$

wherein $p_i$ is the relative power detected by the power reading circuits 8 expressed in voltage divided by a reference power detection (usually the forth power reading, e.g. $p_1 = P_1/P_4$), $x(i), x_1(i), y(i), y_1(i), i=1, 2, 3$ are calibration coefficients obtained by a calibration procedure, said calibration procedure being the central aspect of the present invention, $\vec{s}(\tau_1)$ is the input signal S1 delayed by $\tau_1$ which actually consists of a base band signal up-converted to the carrier frequency $f_0$, $s_2(\tau_2)$ is the input signal delayed by $\tau_2$ by the second delay line 5, the input signal of which is $S_2$ and actually consists of a baseband signal up-converted to the carrier frequency $f_0$, and $\Delta\tau = \tau_1 - \tau_2$, it is to be noted that $\Delta\tau$ is greater or equal to the sampling period of the A/D converter 9, that also one of the delay constants can be 0.

It can be seen that in the case that the change of the total frequency content in the two samples of the signal multiplied with the difference in the time delay is constant or if it could be neglected, one can obtain information about the relative change in the amplitude and phase from one sample to the other, or the relative increment or decrement of the I/Q signals.

The detection of this value it particularly correct in the case when the oscillating period of the main carrier is much more smaller than the sampling period (so that a virtually quasi steady state is obtained in the passive circuit 7 and the power detection by the power reading circuits 8 can be performed.

The calibration procedure is a procedure which is necessary in order to obtain calibration coefficients x(i), y(i). The calibration can be done without disconnecting the physical connections of the system. The calibration procedure which can be performed in an off-line approach. The system parameters do not alter fast, so that off-line calculations can be performed in the period T. The period T is much larger than the signal symbol duration.

The calibration coefficients are obtained by the inventive calibration process and they are used for relative signal detection in conjunction with power reading. In the very first minute before updating with data from calibration procedure values from a memory, initial calibration values are utilized for the calculation of a relative signal.

After performing the non-coherent detection of the I/Q mathematically calculated values in the digital signal processing unit 10, a demodulation procedure is executed. The demodulation procedure can be performed by the hardware structures (e.g. I/Q demodulator chips) or with the DSP software (e.g. the same DSP which is used for calculation of the calibration coefficients and for calculation of the complex signal). It is to be noted that for some applications the complex signal can be directly utilized for the demodulation without its decomposition in the I- or Q-information (data stream). Due to the inherently proposed non-coherent detection it is necessary to apply a differential processing of the data streams before approaching D/A converters and further I/Q ports of the transmitter modulator.

In the following an example for the function of the invention will be explained referencing to FIG. 2 and FIGS. 5–9.

In the following explanation as an example a differential QPSK modulated signal is assumed to be received and demodulated. Additional assumptions are invariant to the system concept and they are utilized only for the simplified demonstration and explanation of the system.

It is to be noted that the kind of modulation used does not alter the principal functionality of the proposed receiver, so that all kinds of combinations of modulation schemes can be utilized if they are processed differentially before approaching D/A converters and I/Q ports of the transceiver. It is furthermore to be noted that the structure of the passive circuit 7 is invariant.

In the following explanation it is assumed that the delay difference equals to the sampling period. Furthermore it is assumed that the RF frequency signals have the same power level than supplied to the passive circuit 7. The incoming RF signal is differentially modulated and sent by the transmitter. The passive circuit 7 consists of ideal sub-circuits which need not to be calibrated according to the present simplified example. Furthermore ideal linear power reading circuits (power detectors) 8 are considered. The passive structure can be as shown in FIG. 2.

In the following table 1 the resultant power readings normalized over power reading from the power detector P1 are presented for a set of differential phase differences in the case of a constant signal amplitude (ideal detection).

Figure 5:
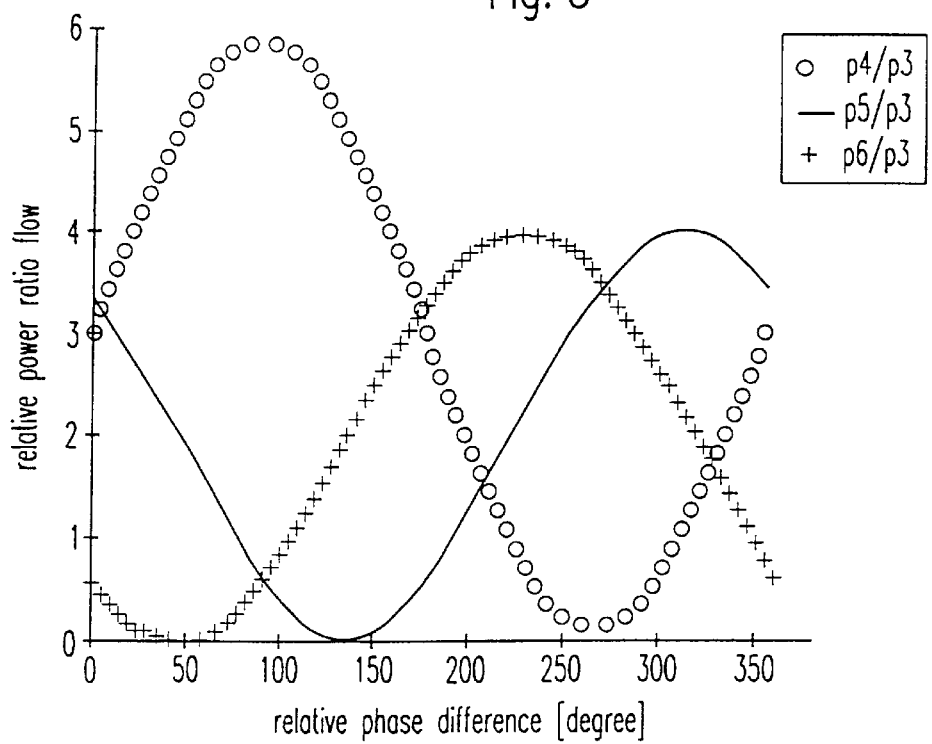
FIG. 5 shows the relation between the relative power ratios detected by the non-coherent six-port receiver and the relative phase difference of a divided digital modulated input signal.

FIG. 5 shows the variation of the relative power levels (voltage at power detectors) as a function of the relative phase difference. In FIG. 5 it is assumed that there is no amplitude variation between time samples and both incoming signals S1, S2 have the same power level.

Figure 6:
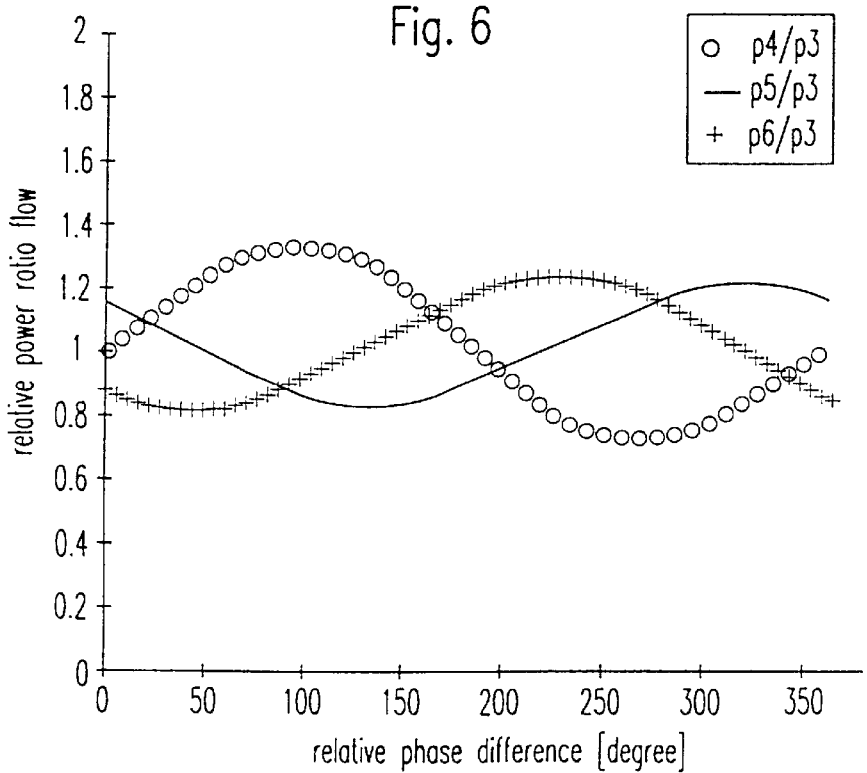
FIG. 6 is a graphic representation similar to FIG. 5, but under the assumption that the incoming signals have a relative power level difference of 20 dB.

FIG. 6 is a representation similar to FIG. 5, but with the assumption that the incoming signals have a relative power level difference of 20 dB.

From FIGS. 5 and 6 it can be concluded that the sensitivity of the system decreases if the power level difference of the incoming signal S1, S2 increases. This situation can occur, if only one delay line 5, 6 is used in the system configuration, so that one of the incoming signals S1, S2 is also attenuated relatively to the other one which is not delayed.

It is to be noted that the relative power levels are independent of the RF signal level. Furthermore it is to be noted that, if the number of phase (or amplitude) states is low, there is no need in some cases for a calculation of the relative signal amplitude and phases because a simple decision logic can be established based on a simple comparison of the analog voltages (power levels). This is for example true for a (D)PSK modulation.

Figure 7:
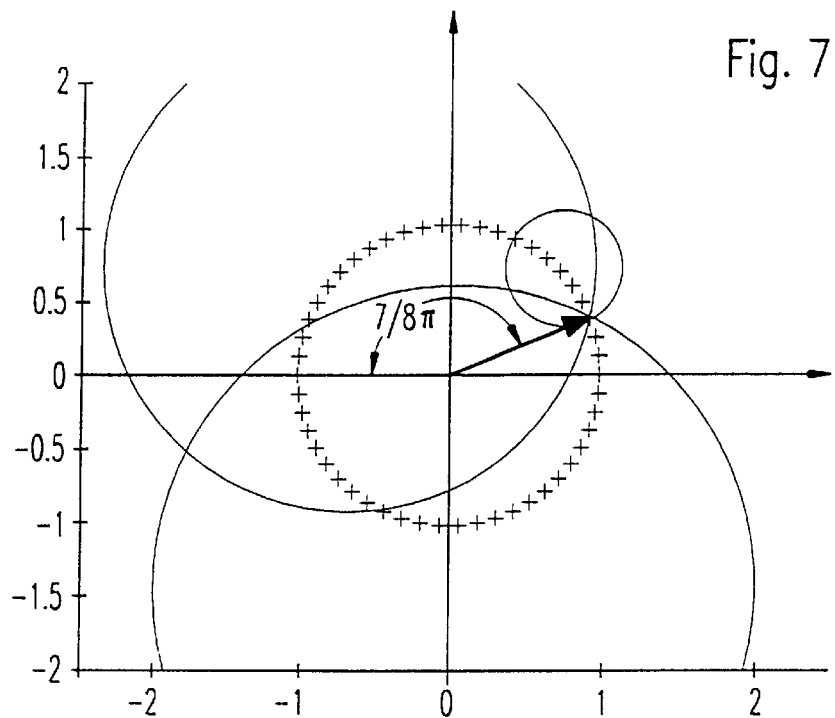
FIG. 7 shows an example of the calculation procedure required to obtain a phase change and the amplitude of the signal, wherein the phase change takes the value of 157.5° (7π/8), the magnitude of the signal remaining the same.

FIG. 7 shows a principle calculation required to be performed in the digital signal processing unit 10 of the receiver. FIG. 7 shows as an example the state that the two signals S1, S2 have the same magnitude in two different time points (QPSK modulation) and the phase difference is $7\pi/8$ by detecting and calculating the measured power levels and the calibration coefficients as shown three circles are obtained. Ideally they cross in one point. When the crossing point is connected to the center of the grid, the thus created vector represents the complex ratio of the signals S1, S2 at two different time increments, which time increment is defined by the relative delay provided by the two delay lines 5, 6. To obtain the complex value a mathematical processing is required to calculate the crossing point of the known circles (the circles are defined by the calibration coefficients).

As can be seen from FIG. 7, the vector directing from the origin of the grid to the crossing point of the three circles has a length (amplitude) corresponding to one unit and represents an angle of 157.5° ($7\pi/8$). The fact that the vector has the length corresponding to one unit represents the fact, that the two signals S1, S2 have the same magnitude, as it is the case e.g. for the QPSK modulation.

Figure 8:
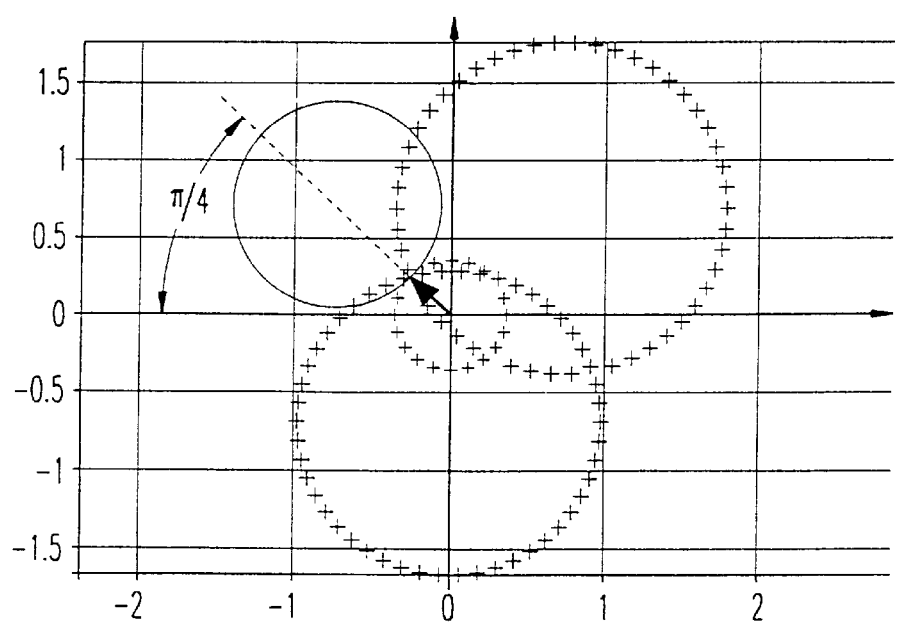
FIG. 8 shows an example under the assumption that the relative change of the incoming signal is three times in magnitude and 45.5° (π/4) in phase.

FIG. 8 shows the case, that the two signals S1, S2 are different in phase and magnitude. FIG. 8 shows as an example the state that the relative change of the signal is three times in the magnitude and 45.5° ($\pi/4$) in phase. As can be seen from FIG. 8, the vector direction from the origin of the grid to the crossing point of the three circles has a length corresponding to 1/3 units and an angle of 45.5° ($\pi/4$).

It is to be noted that the results of the calculation generally are not the final complex value of this signal. The direct

TABLE 1

| Relative phase difference ang(s(t))- ang(s(t-τ)) | P4/P1 | P3/P1 | P2/P1 | Decision logic tolerances for P4/P1 | Decision logic tolerances for P3/P1 | Decision logic tolerances for P2/P1 |
| --- | --- | --- | --- | --- | --- | --- |
| 0 | 3 | 3.414 | 0.5857 | 1 to 5 | 2 to 4 | 0 to 2 |
| $\pi/2$ | 5.8258 | 0.585 | 0.585 | 5 to 5.825 | 0 to 2 | 0 to 2 |
| $\pi$ | 3 | 0.585 | 3.414 | 1 to 5 | 0 to 2 | 2 to 4 |
| $3\pi/2$ | 0 | 3.414 | 3.414 | 1 to 1.17 | 2 to 4 | 2 to 4 | six-port receiver detects differences between the two signals S1, S2, so that any relative change in signal from one to another time step can be detected. That means that before the transmission of the up-converted signal, the digital data before supplied to the transmitter I/Q modulator via D/A converter have to be differentially processed which is inherently true for DPSK modulation schemes. In case the transmitted digital data are not differentially modulated, reference samples have to be sent in order to provide a reference magnitude and a reference phase for the detection of the absolute values of the modulated digital data.

In real, i.e. not ideal circuits the three circles do not cross exactly in the same point. Therefore there is usually some offset in the circles' crossings, which has to be mathematically treated. The offset is due to the fact that the calibration coefficients are not optimally obtained. A further reason for the offset can be different noise effects. Different approaches can be utilized in the signal processing of the digital signal processing unit 10 to "decide" where to place a crossing point. For example the geometric median of the curved triangle can be taken as the crossing point. However, the offset can be neglected in some cases, where a relative low number of the modulation states are considered, as it is the case e.g. for a QPSK modulation scheme.

In the following it will be explained referencing to FIGS. 1a, 1b as well as FIGS. 9 to 11 how a six-port receiver, whether coherent or not, can be calibrated according to the present invention. The calibration procedure of the six-port receiver is the central object of the present invention.

The central feature of the present invention is to feed the six-port receiver with a signal which is called calibration sequence, at the RF signal input. The calibration sequence can be a RF frequency signal, which is modulated by a constant envelope modulation. The minimum number of different states (or symbols) within the constant envelope modulation is five. The calibration sequence can be a n-PSK modulated signal on a RF frequency. The RF carrier of the calibration sequence does not need to be highly stabilized and does not need to have large power. In the case of effecting the calibration with a n-PSK modulated signal, the number of the symbols containing n-PSK states N is larger or equal to five states or symbols, wherein n is greater or equal to N.

The phase states taking part in the calibration should be well distributed concerning magnitude and/or phase variations of the applies modulation. In the case of n-PSK signals a minimal phase distance of 2p/N is particularly advantageous.

The order of the different phase states can be adapted to the calibration of a coherent or non-coherent type of a direct six-port receiver. As can be seen from FIG. 1a and FIG. 1b the calibration sequence is fed to the RF signal input of the receiving apparatus. The passive circuit 7 outputs four power levels P1 to P4, which power levels P1 to P4 are processed in the digital signal processing unit 10. The digital signal processing unit 10 processes the supplied power levels P1 to P4 to obtain in the ideal case exactly the values of the input calibration sequence. A second DSP-unit (control unit) 20, which is shown incorporated in the DSP-unit 10, compares the output of the demodulation circuit of the DSP-unit 10 with the known values of the calibration sequence and adjusts the calibration coefficients of the DSP-unit 10 in accordance with the detected differences between the obtained value of the DSP-unit 10 and the known values of the calibration sequence.

The calibration coefficients are complex values required for calibration of the six-port receiver in order to obtain correct complex ratio of two signals. The calibration coefficients are obtained by the inventive calibration procedure. The calibration coefficients can be averaged in different forms or statistically set due to the values obtained from two or more calibration procedures.

The calibration sequence input to the receiving apparatus is a signal wherein a RF carrier is modulated by the number of symbols, which contain at least five different symbols. The RF carrier is related to the RF frequency for which the receiving apparatus is designed to work. The RF carrier of the calibration sequence does not need to be highly stabilized. 1% to 3% tolerances of the carrier can be tolerated. If the receiving apparatus is designed as wide-band device, more than one sequence can be extended with more symbols and can consist of:

a) more RF frequency carriers taken from a frequency band of operation with one calibration sequence (one modulated RF frequency after the other), and b) one RF frequency carrier taken from the frequency band of operation within one calibration sequence. By the next calibration another RF frequency taken from the frequency bands of operation modulated by the same or different symbols can be used.

The calibration sequence has a fixed duration which allows the necessarily required and optimized redundancy. The calibration data redundancy is required for overcoming statistical errors to be introduced by mathematical calculation of the calibration coefficients. The absolute minimum duration of the sequence is five time samples of the sampling rate of the used six-port receiving apparatus.

The calibration procedure could be performed during the common silence period of the receiver in the case of e.g. a TDD working scenario. The signal from the transmitter can be used for calibration, if the receiving apparatus is a part of the transceiver. The calculation of the calibration coefficients could be done off-line concerning the normal signal receiving period. The calibration of the system should be done in larger periods. The duration of the calibration sequence in relation to the repetition period of applying the sequence is of the order larger than $10^6$, so that the waste of data rate through put due to the performing of the calibration procedure can be ignored, also if there is no TDD operation. It is to be noted that the actual calculation of the calibration coefficients could be performed in the off-line operation. It is not necessary to make calibrations in the periods less than tens of seconds or even of minutes. The repeating of the calibration sequence depends on the working scenario of the system, the expectant gradient of changes of temperature influence on passive components, partly on RF frequency and base band width and has to be set individually case by case.

Now a calibration sequence for a non-coherent direct six-port receiver will be explained. The proposed procedure is actually a 8-PSK modulated signal sequence. The duration of the sequence is nine samples, as can be seen from the phase combinations example given the following table 2.

TABLE 2

| Order of symbols/ state within the "calibration sequence" | Phase states of the "calibration sequence" θ can take values from 0 to 2π | Relative phase difference angle (s(t)-angle (s(t-τ)), τ is sample period |
|---|---|---|
| 1 | 0 + θ | not known, not relevant, or π |
| 2 | 0 + θ | 0 |

TABLE 2-continued

| Order of symbols/ state within the "calibration sequence" | Phase states of the "calibration sequence" θ can take values from 0 to 2π | Relative phase difference angle (s(t)-angle (s(t-τ)), τ is sample period |
|---|---|---|
| 3 | π + θ | π |
| 4 | ¾π + θ | 7/4 π |
| 5 | 3/2 π + 0 | ¾π |
| 6 | π + 0 | 3/2 π |
| 7 | 3/2 π + θ | ½π |
| 8 | ¾π + θ | 5/4 π |
| 9 | π | ¼π |

It can be seen from table 2 that the proposed phase sequence produces seven independent load states to be used for the calibration of the calibration coefficients of the six-port receiver. The third column of table 1 shows that phase sequence is chosen in the way that the relative phase differences alter from one sample to another with maximum values, taking full distribution of the phase points by automatic calculation of the coefficients. It is to be noted that sets of five loads with four samples in the same moment are necessary to calculate calibration coefficients in the ideal case, i.e. in the case that there is no significant noise level. For the automatic calculation procedure some redundant values are usually required to calculate and to smooth the values of the calibration coefficients. The use of simple shifting of the sets of values could be automatically utilized to solve the algorithm equations. Due to the successive distribution of relative phases sets of sampled values are well-presented in the same, which are well-distributed from one sample to another.

Theoretically five loads should be enough to calculate the calibration constants (coefficients), if a perfect sliding short technique can be used, as it is described in the documents of Stumper and Wiedmann cited in the introductory part. That should be enough also in the case when one has a sliding short having reflection coefficients which has constant (but not unity) magnitude instead of a perfect sliding short. This fact is important, because at the output from the delay line (see references 5, 6 in FIG. 1a) some losses (time invariant, 5–8 dB) are expected. If this is the case, instead of the 8-PSK modulation a 16-PSK sequence built with the same rules and having theoretically 15 independent phase states, should be used. Eleven loads are enough to deal with arbitrary loads and to calculate rigorously calibration coefficients. This is approved theoretically in the above-mentioned document of Engen.

Now a calibration sequence for a coherent direct six-port receiver will be explained referencing to the following table 3.

TABLE 3

| Order of symbols/state within the "calibration sequence" | Relative phase states of the "calibration sequence" θ can take take values from 0 to 2π |
|---|---|
| 1 | 0 + q |
| 2 | p + q |
| 3 | 7/4 p + q |
| 4 | ¾ p + q |
| 5 | ½ p + q |
| 6 | ½ p + q |
| 7 | 5/4 p + q |
| 8 | ¼ p + q |

As can be seen from table 3 there are eight independent phase states in a particular order, chosen in the way to take into account all different states but with maximum local phase difference. This is advantageous in the sense to make processing of the data faster and more efficient.

However, in the most practical cases direct six-port receiver will be used for detection of the signals which are modulated with a known modulation. In that case it is possible to perform a calibration procedure a set forth below which has the advantage of requiring less mathematical effort which reduces time required for the calculation of the calibration coefficients and makes the six-port receiver more efficient. This advantage is even larger if the calibration of the six-port receiver due to the environmental changes is needed and if the modulation scheme used comprises only a low number of states (for example four states).

In general it is possible by using a PSK modulated sequence fed to the input of the six-port receiver to calculate the calibration coefficients which can then be applied for any arbitrary modulation. In that case a complicate mathematical procedure is required as set forth above. A RF signal which is PSK modulated works like a sliding short, so that the numerical approach as set forth above can be applied. It requires finding of the five initial estimates for six to four port reduction. Numerical procedure of the iterative solving of non-linear equation with five unknowns follows. After that a linear equation systems with three unknowns is required. In general the required mathematical effort is quite large and can decrease the system performance in same cases, specially in those where calibration procedure described above should be performed repeatedly due to environmental influences.

In order to minimize this mathematical efforts and make an six-port receiver more efficient in the cases when the applied RF modulation is known (predetermined) the following method is of advantage:

It is assumed that the applied RF modulation for which the six-port receiver is to be used as a down converter device comprises N states which are known:

$$a(1), a(2), \ldots a(N-1), a(N) \tag{B1}$$

It is assumed that the calibration sequence contains all of the possible N states, wherein the relative position of the states n the calibration sequence chain is irrelevant. Because of the non-ideal parameters of the six-port receiver, the six-port receiver will detect respective values of:

$$b(1), b(2), \ldots b(N-1), b(N) \tag{B2}$$

where all of the values a(x) and b(x) are complex values.

It is assumed that the calibration of the six-port receiver can be achieved in the manner that detected results should be treated by the following polynomial expression:

$$a(1) = X_1 + b(1)^* X_2 + b(1)^{2*} X_3 30\ b(1)^{3*} X_4 + b(1)^{(N-2)*} X_{N-1} + b(1)^{(N-1)*} X_N$$

$$a(2) = X_1 + b(2)^* X_2 + b(2)^{2*} X_3 30\ b(2)^{3*} X_4 + b(2)^{(N-2)*} X_{N-1} + b(2)^{(N-1)*} X_N$$

...

...

$$a(N-1) = X_1 + b(N-1)^* X_2 + b(N-1)^{2*} X_3 + b(N-1)^{3*} X_4 + b(N-1)^{(N-2)*} X_{N-1} + b(N-1)^{(N-1)*} X_N$$

$$a(N) = X_1 + b(N)^* X_2 + b(N)^{2*} X_3 + b(N)^{3*} X_4 + b(N)^{(N-2)*} X_{N-1} + b(N)^{(N-1)*} X_N \tag{B3}$$

that is, in the a matrix notation it results in the following:

$$[A] = [B][X] \tag{B4}$$

wherein $$\text{Matrix } [B] = \begin{pmatrix} 1 & b(1) & b(1)^2 & b(1)^3 & b(1)^{(N-2)} & b(1)^{(N-1)} \\ 1 & b(2) & b(2)^2 & b(2)^3 & b(2)^{(N-2)} & b(2)^{(N-1)} \\ & & & & & \\ 1 & b(N-1) & b(N-1)^2 & b(N-1)^3 & b(N-1)^{(N-2)} & b(N-1)^{(N-1)} \\ 1 & b(N) & b(N)^2 & b(N)^3 & b(N)^{(N-2)} & b(N)^{(N-1)} \end{pmatrix} \quad (B5)$$

Solving the matrix equation (B4) one obtains $$[X]=[B]^{-1}[A] \quad (B6)$$

Once the vector X is obtained, in an automatic process the multiplication of the detected values with the polynomial form due to the equation (B6) can be effected.

$$V_{corrected}=X_1+V_{uncorrected}*X_2+V_{uncorrected}^2*X_3 0 \ldots + V_{uncorrected}^{(N-1)}*X_N \quad (B7)$$

Due to the correction polynomial it is possible to realize effective multiplication and summing even in real time operation. For some kinds of modulations scheme with a known number of states, the order of the correction polynomial can be smaller than the number of available modulation states without introducing large errors.

Theoretically seen only one calibration sequence having all of the possible modulation states should be enough to obtain calibration vector X. In praxis it is proposed to apply more sequences or to repeat calibration procedure in some time periods in order to minimize different sources of errors to ensure statistically stable calibration vector X.

In the case of effecting calibration with the values coming from remote source noise can be presented. Taking into account its potential random nature the following approaches are proposed:

a) to repeat the same calibration sequence containing all of the states. Following the statistical middle value of each state and calculate the calibration vector X can be calculated. In that case equation B6 (Matrix [B]) would contain the instead of a combination of the values b(i) the values $$\frac{1}{m}\sum_1^m b(i)$$

wherein m is smaller or equal to a repetition number of the calibration sequences.

b) to calculate for each of the repeated sequence the calibration vector [X] and after that to calculate the middle values of all the vector values or to calculate the middle value for a part of the obtained calibration values, omitting some border values. The final elements of the calibration vector [X], Xi are than obtained by following formula $$\frac{1}{m}\sum_1^m Xi,$$

where m is smaller or equal to the number of repeated calibration sequences.

c) Combination of the approaches a) and b) is also proposed. In that case, the obtained calibration vector [X] using approach a) or approach b) can be used to calculate a middle value instead of replacing the old calibration vector. In that case the values of the new calibration vector [X], Xi can be obtained as a $$\frac{1}{2}(Xi(new)+Xi(old)).$$

The further advantage of the proposed approach is that some systematic high frequency errors which are generated before approaching the six-port receiver input can be also eliminated by the proposed calibration concept. That is particularly true for correction of the phase errors coming from antenna and antenna feed side.

SIMULATION EXAMPLES

As a verification of the proposed concept simulations have been performed as shown in FIGS. 16 to 26. In all of the FIGS. 16 to 26 the same passive structure consisting of several power divider and 90 degrees hybrids for coherent type of the six-port receiver is considered. The RF part of the passive structure is numerically random influenced adding additional reflections and phase shifts of the each RF subassembly: The upper imperfection borders are considered as a absolute worst case. In each of the FIGS. 12 to 22 another type of imperfections is shown, wherein a calibration method according to the present invention has been executed. The applied noise level is also indicated. A QPSK modulated signal is considered and used for the calibration. That means that polynomial of the order four is utilized. Both case approach a) and approach b) are tested obtaining almost identical values.

Note that:
Sign "*" is considered as a value obtained (detected) by the six-port receiver in the case when no calibration is applied.
Sign "+" is used for the correct values
Sign "O" is used for the values corrected by the calibration method according to the present invention and as set forth above.
A circle is used to represent the expected correct values in the case of the NPSK, where n tends to be infinitive The main advantage of the second solution proposed above is reduced mathematical efforts and easy (hardware oriented) practical realization of the calibration.

The main feature of this method according to the present invention is that the RF modulation scheme used is often known (predetermined) in advance. The calibration sequence should include preferably all of the possible modulation states. The calibration coefficients can be statistically adjusted if the incoming calibration sequence is influenced by noise.

The calibration is advantageously useful for (n)QAM modulation schemes and particularly suitable for QPSK modulation.

Now it will be explained referencing to FIG. 9 to FIG. 12 how the calibration sequence can be generated and transmitted to the receiving apparatus 34.

Figure 9:
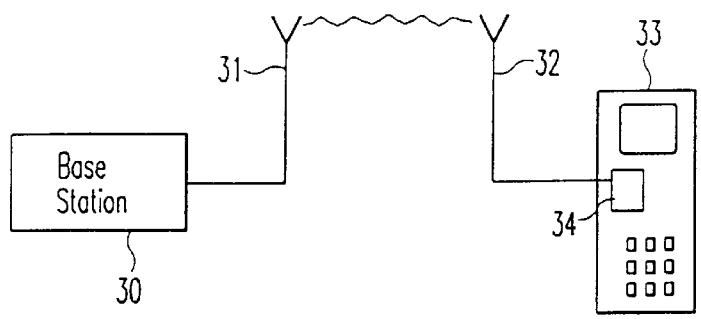
FIG. 9 shows a mobile communication system according to the present invention, wherein a calibration sequence is transmitted from a remote base station to a receiving apparatus provided in a mobile communication device.

FIG. 9 shows as an example the case that the calibration sequence is generated in a base station 30, which represents a remote transmitter. The calibration sequence from the base station 30 is then transmitted over the antennas 31, 32 (over the air) to a mobile communications device 33 (cellular telephone), in which the receiving apparatus to be calibrated is housed. In the shown case of performing the calibration procedure by signal coming from a remote transmitter 30 the calibration sequence is repeated in order to statistically minimize the influence of channel noise.

Figure 10:
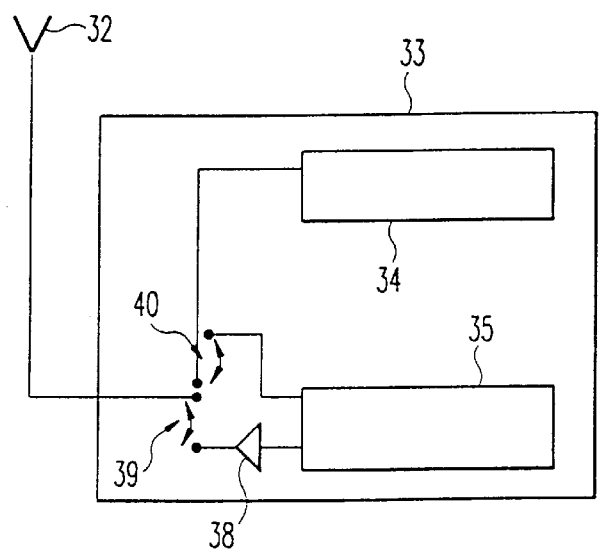
FIG. 10 shows an alternative design of a mobile communication's device, wherein the calibration sequence is transmitted from a local transmitter to the receiving apparatus.

In FIG. 10 as an example the case is shown, that the calibration sequence is generated in a local transmitter 35 and supplied therefrom to the receiving apparatus 34. In the case of the generation of the calibration sequence by the local transmitter (the six-port receiving apparatus is a part of the transceiver), the calibration can be performed by the signals which are sent form the transmitter 35. The calibration sequence signals are fed to the input of the direct six-port receiver before their power amplification.

A time division duplex (TDD) transmitting system is particularly advantageous for the application of calibration generation and transmitting method as shown in FIG. 10. As can be seen from FIG. 10, two switching circuits 39, 40 are provided being changed-over in synchronism with each other. During the transmitting time slot of the TDD system the switching circuits 39, 40 are changed over such that the signal to be transmitted from the local transmitter 35 is amplified (38) and then output to the antenna 32. In the same time, during the transmitting time slot, the switching circuit 40 is changed over to connect the local transmitter 35 to the receiver 34 and thus to give the calibration sequence to the receiver 34. Therefore the calibration can take place in a time economical way during the transmitting time slot. It is to be noted that the power for the calibration given from the transmitter 35 is much less, f.e. ¹⁄₁₀₀₀ of the power given to the antenna and therefore almost negligible.

During the receiving time slot the transmitter 35 is disconnected from the receiver 34 and the signal from the antenna 32 is given to the receiver 34.

If a FDD system is utilized and if up- and down-link channel separation is more than 3% to 5% of the RF carrier frequency, an additional low power RF sub-block is more adapted.

Figure 11:
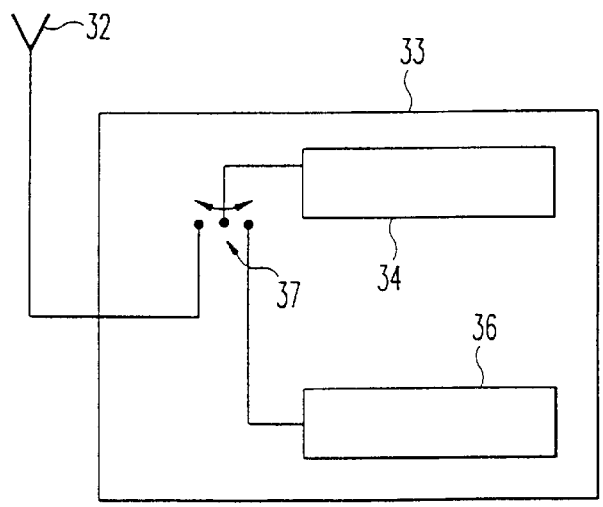
FIG. 11 shows the internal structure of a mobile communications device according to the present invention, wherein a calibration sequence is selectively supplied from a memory to the receiving apparatus.

Such an additional hardware block 36 is shown in FIG. 11. As shown in FIG. 11 the calibration sequence can be selected by a switch 37 to be input to the receiving apparatus 34 to execute the calibration procedure The system shown in FIG. 11 can be implemented in a mobile communications device which is only a receiver or in a transceiver working with a FDD transmission system.

It is to be noted that in the case of a local system as shown in FIG. 10 or FIG. 11, the calibration sequence can be a simple modulated signal and has not necessarily to be same as in the case of the "over the air" calibration as shown in FIG. 9.

Figure 12:
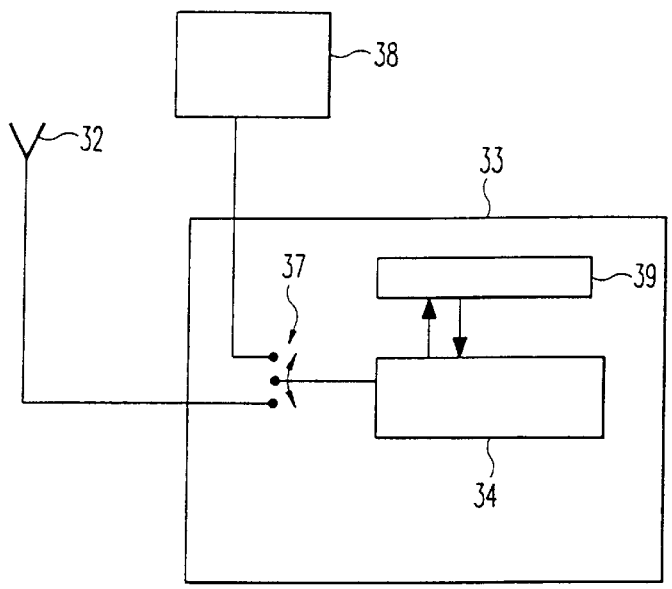
FIG. 12 shows the internal structure of a mobile communications device according to the present invention, wherein a calibration sequence is selectively supplied from a modulated external RF source.

Reference is now made on the example shown in FIG. 12. The embodiment according to FIG. 12 can be used to effect the calibration of the six-port receiver during the assembly of the mobile communications device. This solution is particularly of advantage if the RF characteristics of the six-port device are not influenced during operation by changes of environmental conditions such as temperature etc.

As shown in FIG. 12, according to this embodiment a external RF source 38 is provided. The RF source 38 supplies a RF signal, which has been modulated according to the predefined calibration sequence, to the switch 37. During the assembly of the mobile telecommunications device 33 the calibration procedure is performed once based on the modulated RF signal from the RF source 38. The calibration coefficients are calculated based on the modulated RF signal and fed to a memory 39. The coefficients stored in the memory 39 can then be used without any further recalculation as calibration coefficients in operation.

Figure 13:
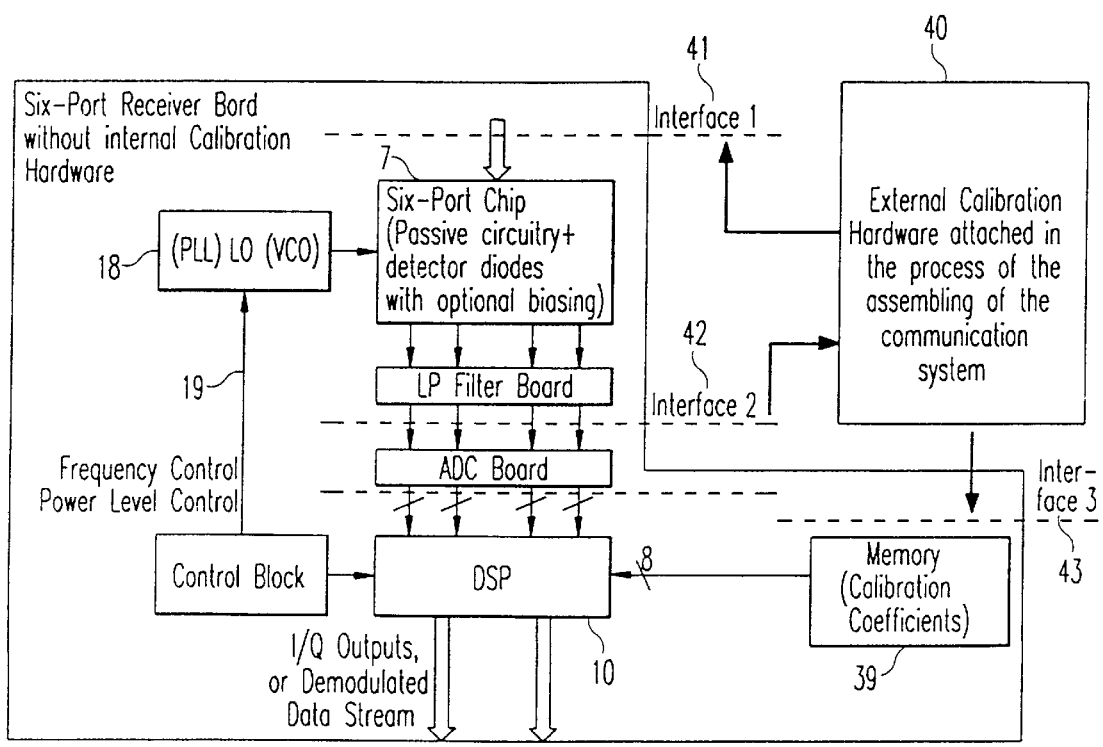
FIG. 13 shows an embodiment for the calibration according to the present invention, wherein the calibration is effected during the manufacturing process.

FIG. 13 shows an embodiment for the calibration according to the present invention, wherein the calibration procedure is effected during the manufacturing (assembly) process. Thereby an external calibration hardware 40 is provided comprising interfaces 41, 42, 43. The interface 41 is connected to an input of a six-port chip 7. The interface 42 obtains filtered output signals of the six-port chip 7. The interface 43 is connected to the memory 33 storing calibration coefficients. The calibration by means of the external calibration hardware block 40 can be effected during an automatic assembling process. The external calibration hardware is attached to the defined interfaces 41, 42, 43 of the assembly containing the six-port receiver 7. The external calibration hardware sends a signal to one of the six-port inputs, takes the signals outputs at the related ports (interface 42), digitally converts the values, calculates the calibration coefficients by means of an external DSP and feeds the calculated calibration coefficients directly to the memory 39 of the six-port receiver.

Figure 14:
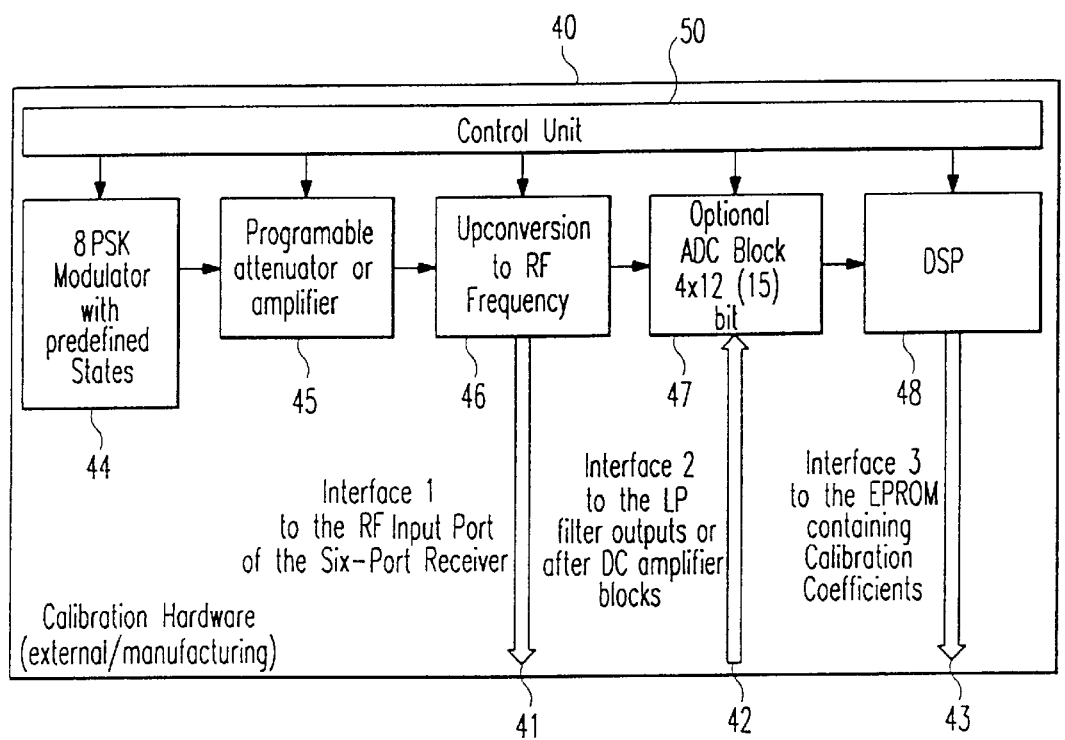
FIG. 14 shows an example for an external calibration hardware block for the calibration during manufacturing according to FIG. 13.

FIG. 14 shows the internal structure of the external calibration hardware block 40 of FIG. 13. A control unit 50 controls a modulator generating predefined states 44, a programmable attenuator or amplifier 45, an upconverter 46, an optional ADC block 47 and a DSP 48. The calibration hardware as shown in FIG. 14 can be used for the automatic calibration of all devices containing six-port receivers. The interface 42 can be placed downwardly of the AD-converter (contained in the board with a six-port receiver). Instead of calculating calibration coefficients in the hardware block, alternatively a DSP receiver used for the calculation of the six-port I/Q signals can be used to perform the calibration (for example, DSP 10).

Figure 15:
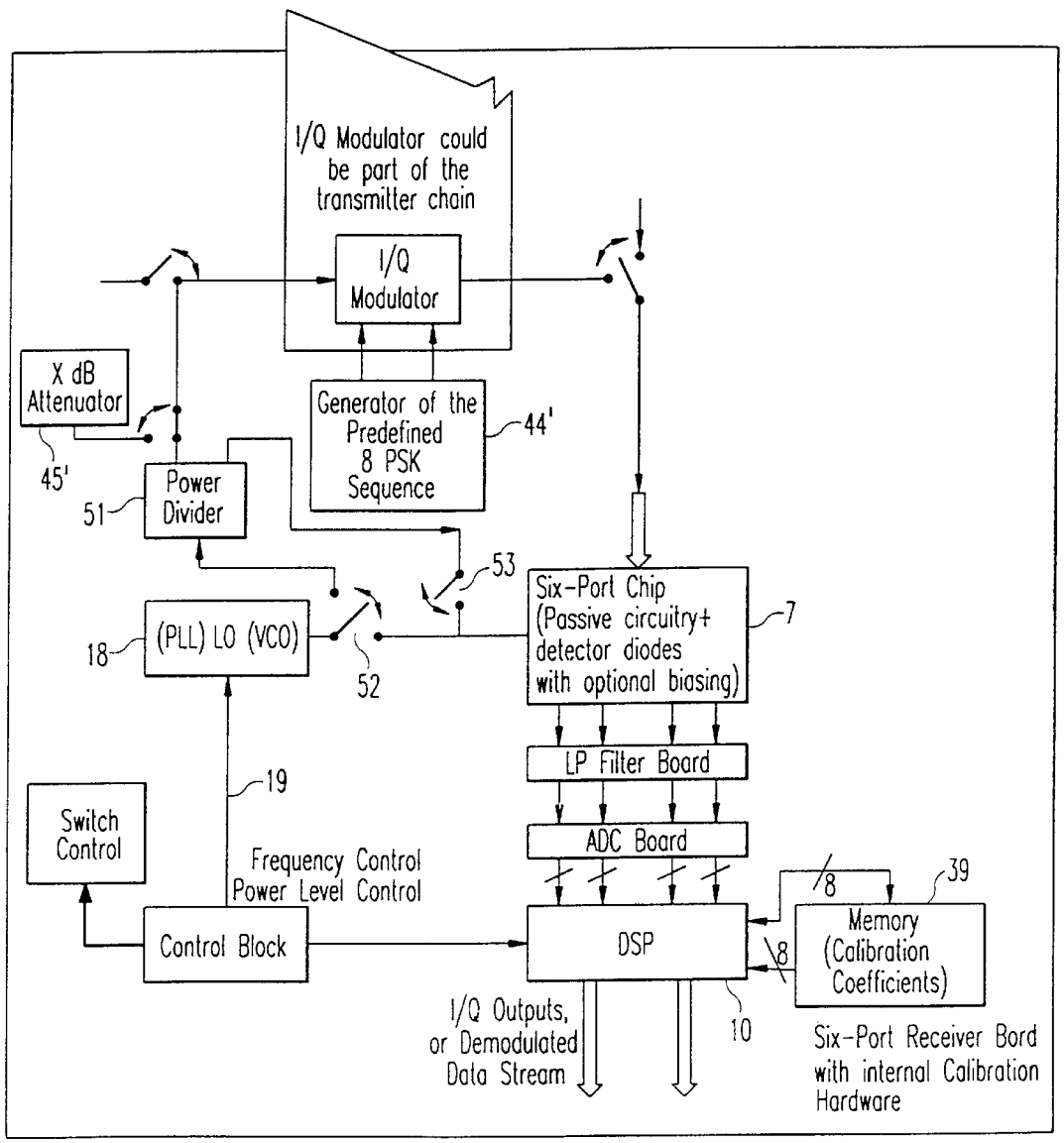
FIG. 15 shows an embodiment for a calibration according to the present invention, wherein the calibration hardware is replaced directly on the same board or chip as the n-port receiver.
Figure 20:
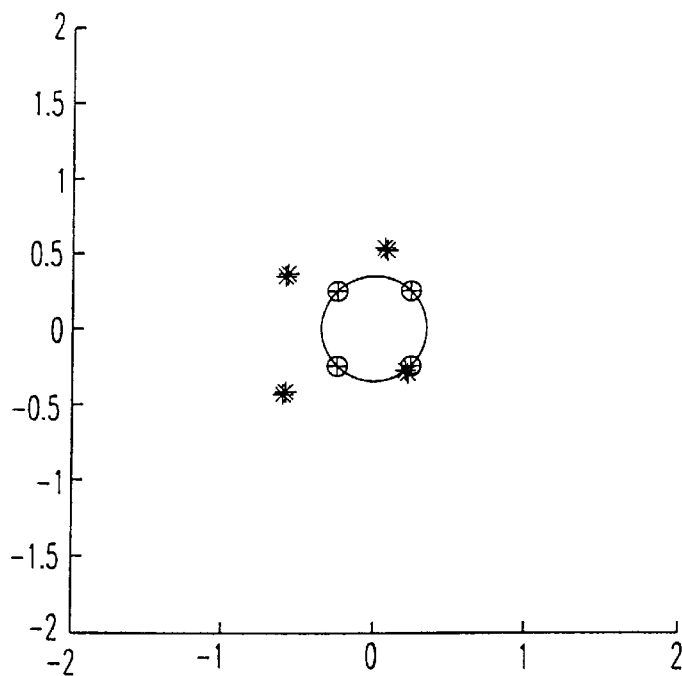
Figure 21:
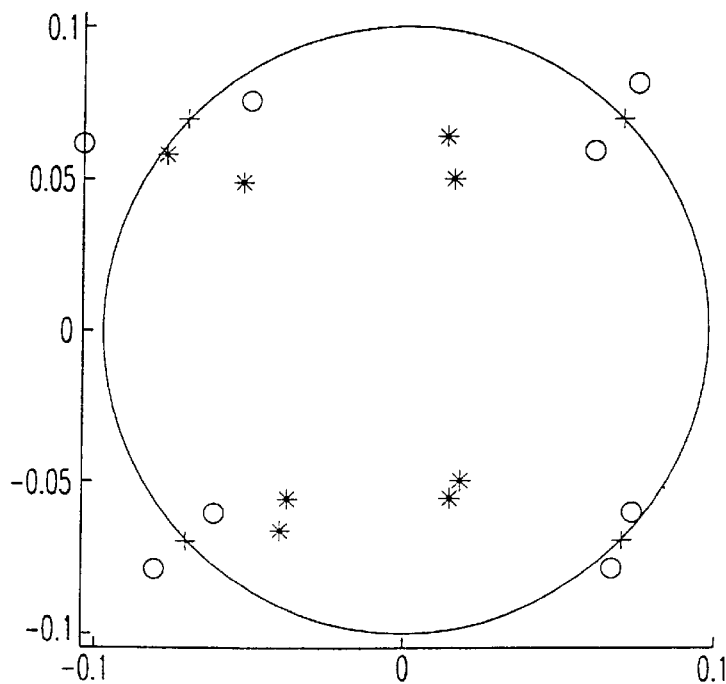
Figure 24:
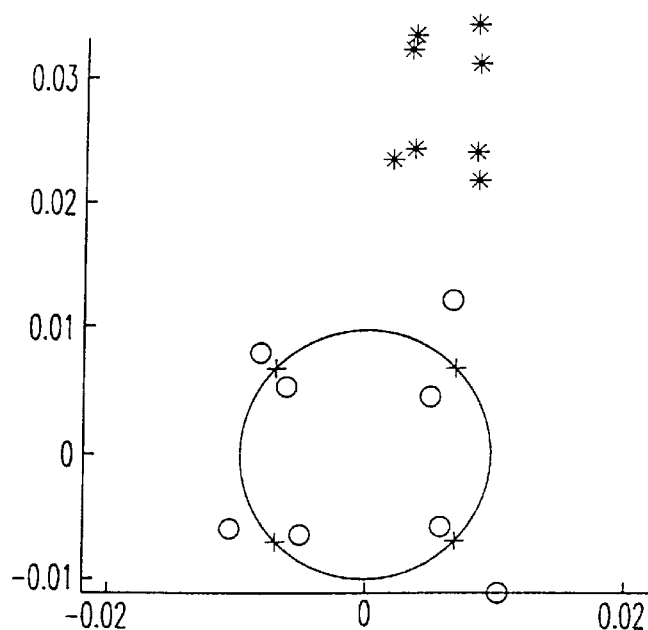
Figure 25:
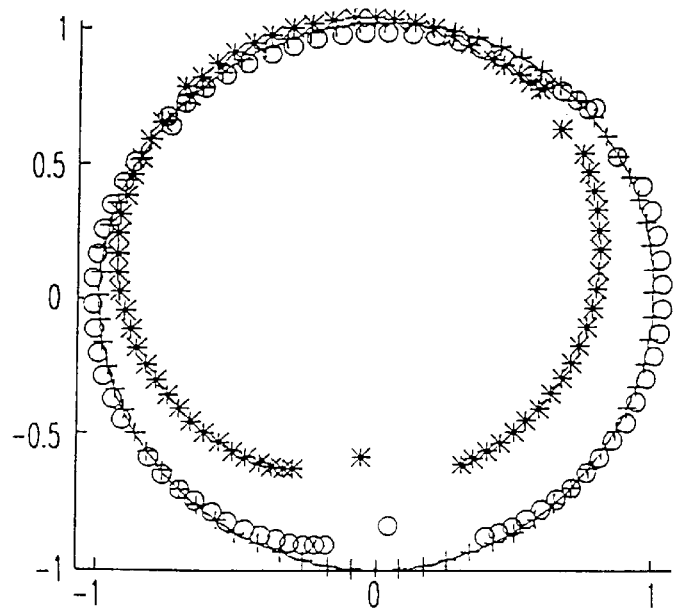
Figure 26:
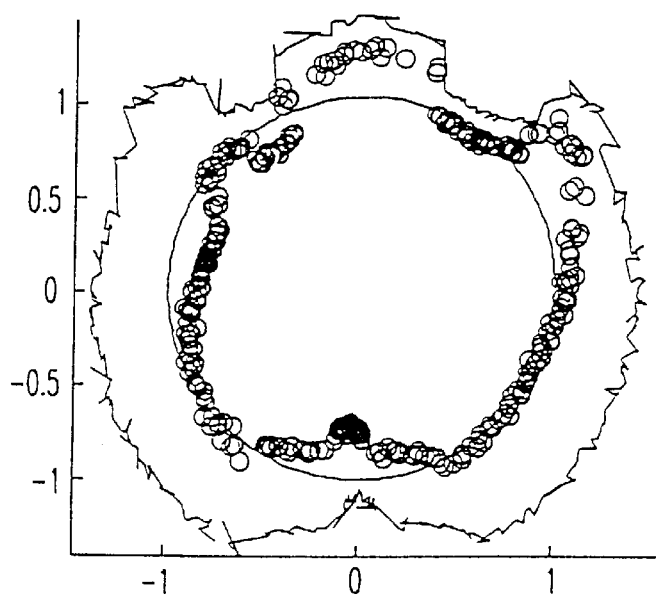

FIG. 15 shows an embodiment of the calibration according to the present invention, wherein a hardware calibration block is placed as an additional chip on the same board as the n-port receiver. In that case, the six-port receiver is only a chip set as shown in FIG. 15. The complexity of the additional components is smaller than in the case of FIG. 13, as some of the blocks can be realized by using the transmitted chain. The integration of the calibration block within the board of the six-port receiver requires: an additional power divider 51 and a X dB attenuator 45' (or a power divider with programmable dividing ratio or, alternatively, a three-port power divider with at least two ports of different power outputs), a baseband block 44' for the generation of the known 8 PSK signal, several switches (for example, 52, 53) and additional controlling requirements. The calibration can be done in the sleeptime (non-active time) of the receiver. Due to the additional blocks the embodiment according to FIG. 15 is more expensive in comparison to the approach according to FIG. 13, but offers the possibility of a calibration of the receiver in the case of environmental changes.

While referencing to a six-port receiver in the following description, it is to be understood that the present invention is generally applicable to n-port receivers, wherein n is an integer which can assume the value of four, five and six. The present invention is by no means limited on the case of n equal to six. The calibration of a n-port receiver is essentially independent of the fact whether n is four, five or six.

What is claimed is:

1. Method for calibrating n-port-receivers,
   wherein n is an integer which can take the value of four, five or six, said n-port-receiver comprising a passive circuit with two inputs, at least one input being supplied with a high-frequency signal to be measured, and at least two outputs (8) supplying power levels (P1, P2, P3, P4) for a signal processing unit (10) which calculates a complex signal being a base on the at least two power levels (P1, P2, P3, P4) and calibration coefficients,
   wherein a predetermined calibration sequence with different symbols is fed to the at least one input of said n-port receiver for the signal to be measured and the calibration coefficients are calculated based on the calibration sequence.

2. Method according to claim 1,
characterized in that
the calibration sequence is a modulated RF signal.

3. Method according to claim 1,
characterized in that
the calibration sequence comprises at least five different states.

4. Method according to claim 1,
characterized in that
the calibration sequence is a PSK modulated signal.

5. Method according to claim 4,
characterized in that
the number of different symbols in the calibration sequence is N and the minimum phase distance between two symbols of the calibration sequence is 2 Pi/N.

6. Method according to claim 1,
characterized in that
the duration of the calibration sequence is at least 5 time sample periods of the n-port receiver.

7. Method according to claim 1,
characterized in that
final calibration coefficients are obtained by averaging previous calibration coefficients.

8. Method according to claim 1,
characterized in that
a predetermined modulation scheme is used,
and the calibration sequence comprises only symbols corresponding to modulation states of the predetermined modulation scheme.

9. Method according to claim 8,
characterized in that
the calibration sequence comprises symbols corresponding to all modulation states of the predetermined modulation scheme.

10. Method according to claim 8,
characterized in that
a calibration vector (X) is calculated on the basis of the following equation:

$$[X]=[B]^{(-1)}[A],$$

wherein [A] is a matrix representing the modulation states of the predetermined modulation scheme, and [B] is a matrix of the values detected by the six-port receiver.

11. Method according to claim 10,
characterized in that
the correction of the output (V) of the six-port receiver is calculated by $$V_{corrected}=X_1+V_{uncorrected}*X_2+V_{uncorrected}^2*X_3+ \ldots +V_{uncorrected}^{(N-1)}*X_N.$$

12. Method according to claim 8,
characterized in that
the calibration sequence is fed repeatedly to an input of the n-port receiver.

13. Method according to claim 1,
characterized in that
the calibration sequence is generated by a remote transmitter (30).

14. Method according to claim 1,
characterized in that
the calibration sequence is generated by an additional hardware block (36) connected to the n-port receiver.

15. Method according to claim 1,
characterized in that
the calibration sequence is generated by a local transmitter (35).

16. Method according to claim 1,
characterized in that
a calibration sequence modulated on a RF frequency is supplied from an external RF source (38) during the assembly process of the device in which the receiver is comprised.

17. Method according to claim 1,
characterized in that
the n-port receiver is a six-port receiver.

18. Method according to claim 1,
characterized in that
the n-port receiver is a five-port receiver.

19. Method of claim 1,
characterized in that
the n-port receiver is comprised in a mobile telecommunications device (33).

20. Receiving apparatus comprising
a n-port-receiver
wherein n in an integer which take value of four, five or six, and the n-port receiver comprises a passive circuit with two inputs, at least one input being supplied with a high-frequency signal to be measured, and at least two outputs supplying power levels (P1, P2,m P3, P4) for a signal processing unit (10) which calculates a complex signal based on the at least two power levels (P1, P2, P3, P4) and calibration coefficients, and
means (30, 35, 36) are provided for supplying a predetermined calibration sequence with different symbols to the at least one input for the signal to be measured,
wherein the signal processing unit (10) calculates the calibration coefficients based on the calibration sequence.

21. Receiving apparatus according to claim 20,
characterized in that
the calibration sequence is a modulated RF signal.

22. Receiving apparatus according to claim 20,
characterized in that
the calibration sequence comprises at least five different states.

23. Receiving apparatus to claim 20,
characterized in that
the calibration sequence is a PSK modulated signal.

24. Receiving apparatus according to claim 23,
characterized in that
the number of different symbols in the calibration sequence is N and the minimum phase distance between two symbols of the calibration sequence is 2 Pi/N.

25. Receiving apparatus according to claim 20,
characterized in that
the duration of the calibration sequence is at least 5 time sample periods of the n-port receiver.

26. Receiving apparatus according to claim 20,
characterized in that
the means for supplying the calibration sequence is a remote transmitter (30).

27. Receiving apparatus according to claim 20, characterized in that
the means for supplying the calibration sequence is an additional hardware block (36) connected to the n-port receiver.

28. Receiving apparatus according to claim 20, characterized in that
the means for supplying the calibration sequence is a local transmitter (35).

29. Receiving apparatus according to claim 20, characterized in that
the means for supplying the calibration sequence is an external RF source (38).

30. Receiving apparatus according to claim 20, characterized in that
the n-port receiver is a six-port receiver.

31. Mobile telecommunications device Comprising
a n-port-receiver
wherein n in an integer which take value of four, five or six, and the n-port receiver comprises a passive circuit with two inputs, at least one input being supplied with a high-frequency signal to be measured, and at least two outputs supplying power levels (P1, P2,m P3, P4) for a signal processing unit (10) which calculates a complex signal based on the at least two power levels (P1, P2, P3, P4) and calibration coefficients, and means (30, 35, 36) are provided for supplying a predetermined calibration sequence with different symbols to the at least one input for the signal to be measured,
wherein the signal processing unit (10) calculates the calibration coefficients based on the calibration sequence.

* * * * *